United States Patent [19]

Shebini

[11] Patent Number: 4,858,146
[45] Date of Patent: Aug. 15, 1989

[54] AUTOMATED DESIGN OF STRUCTURES USING A FINITE ELEMENT DATABASE

[75] Inventor: Nader O. Shebini, Kenner, La.

[73] Assignee: The Babcock & Wilcox Company, New Orleans, La.

[21] Appl. No.: 895,971

[22] Filed: Aug. 13, 1986

[51] Int. Cl.[4] .................. G06F 9/44; G06F 15/60; G05B 17/02

[52] U.S. Cl. ............................ 364/512; 364/578; 364/916.3; 364/920.2

[58] Field of Search .......... 364/505, 512, 578, 200, 364/300, 900

[56] References Cited

U.S. PATENT DOCUMENTS

| 3,639,912 | 2/1972 | Campbell | 364/200 |
| 4,476,528 | 10/1984 | Matsumoto et al. | 364/200 |
| 4,558,413 | 12/1985 | Schmidt et al. | 364/300 |
| 4,635,189 | 1/1987 | Kendall | 364/200 |
| 4,644,471 | 2/1987 | Kojima et al. | 364/300 |

OTHER PUBLICATIONS

Shebini: FEDOS: A Finite Element Database for Offshore Structures. The Computer Journal, vol. 28, No. 3. 1985.

Shebini: Computer System for handling large scale finite-element structural models. Computer Bulletin, Publication of the British Computer Society. Series 2 No. 18. Sep. 1977.

McDermott Marine Engineering presents CADAD Computer-Aided Design, Analysis and Drafting. Oct. 1985.

*Primary Examiner*—Felix D. Gruber
*Attorney, Agent, or Firm*—Vytas R. Matas; Robert J. Edwards

[57] ABSTRACT

A design and analysis system uses an engineering data base in which Finite Element Models of structural components, such as offshore structures are stored. The data base is controlled by a network type database management system to provide input of "finite element" model data into the database from an external design engineering source and output of model data to non-design engineering sources with all sources having concurrent access to the database.

28 Claims, 37 Drawing Sheets

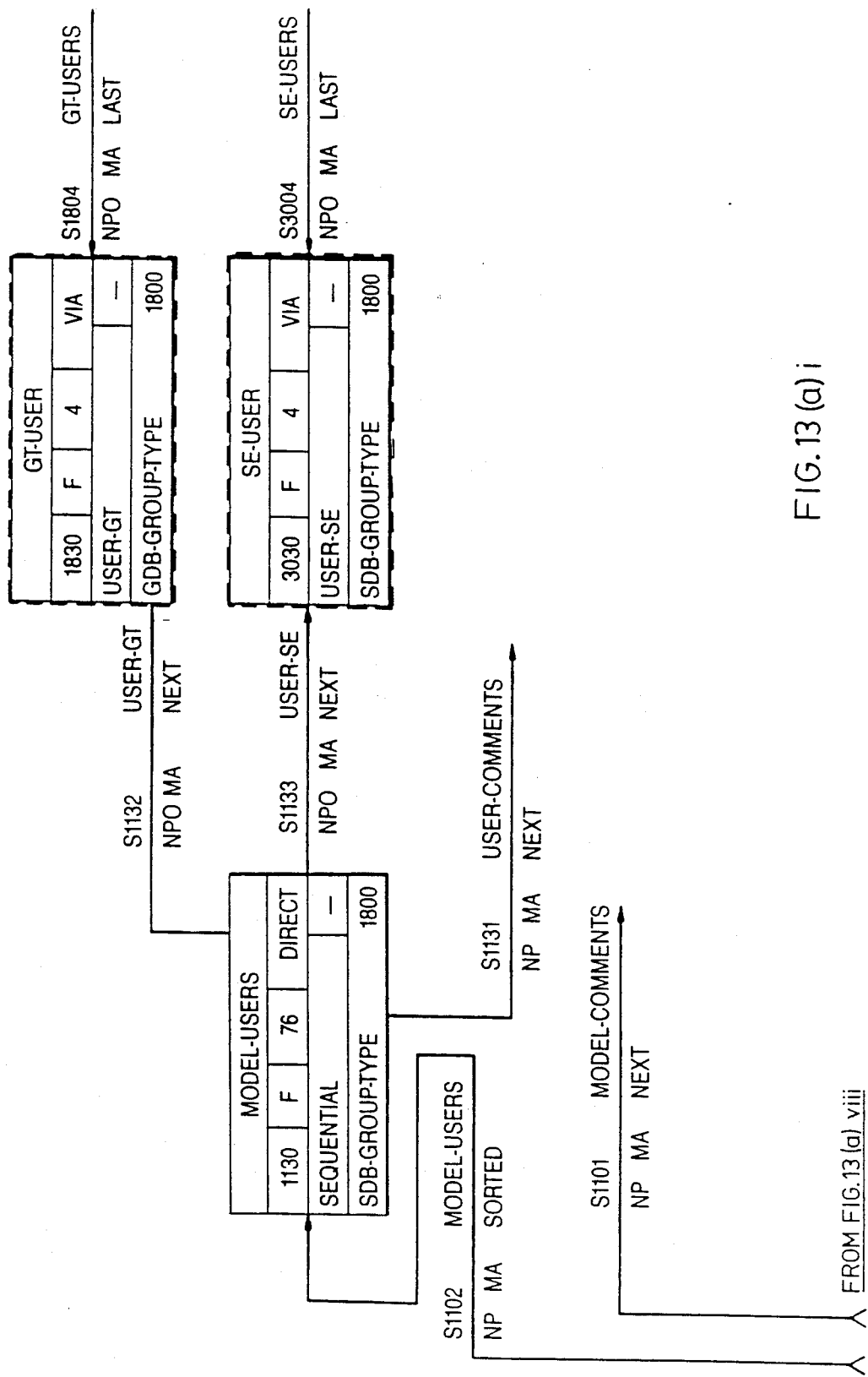
FIG. 13 (a) i

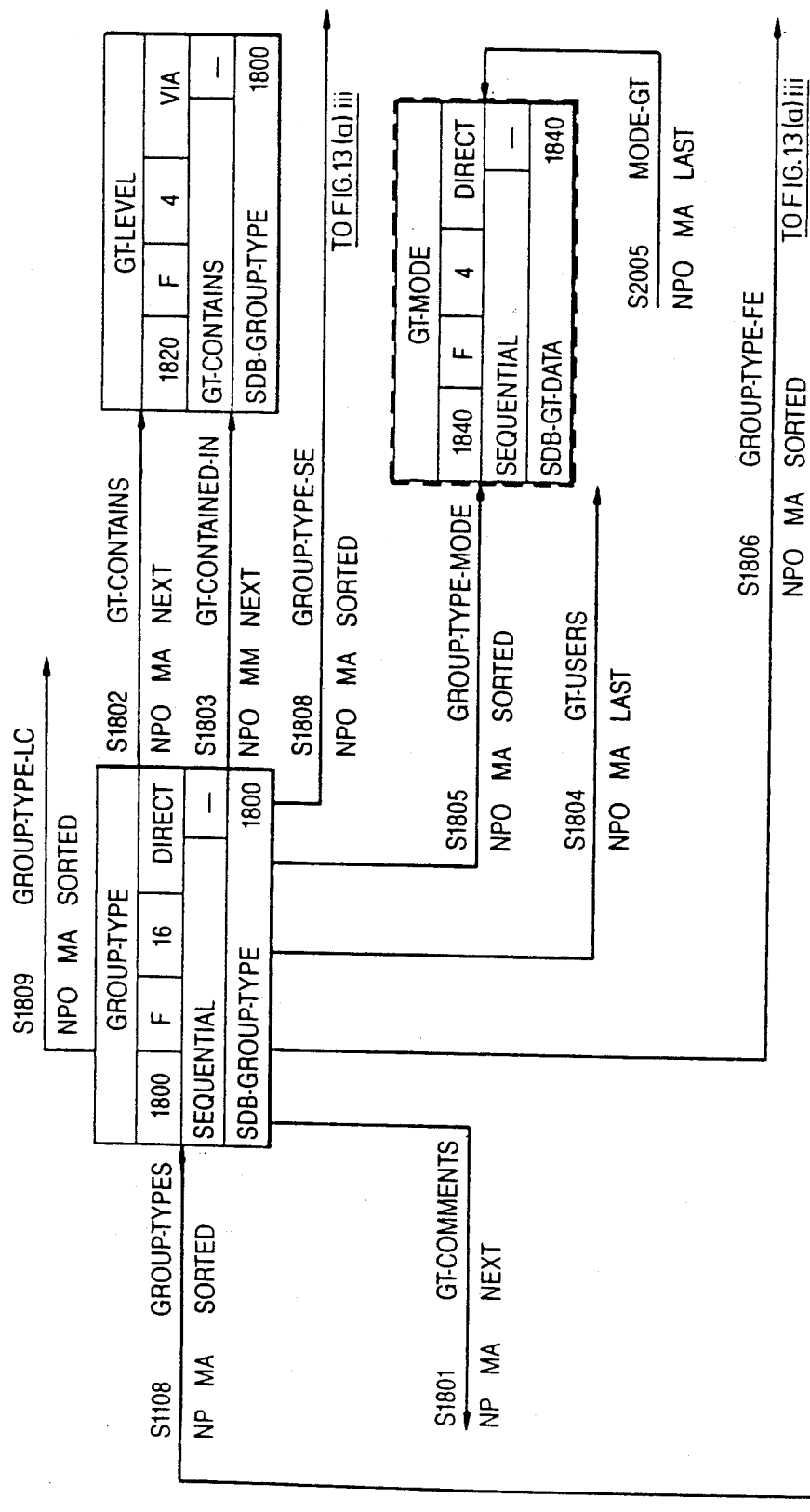
FIG.13(a) ii

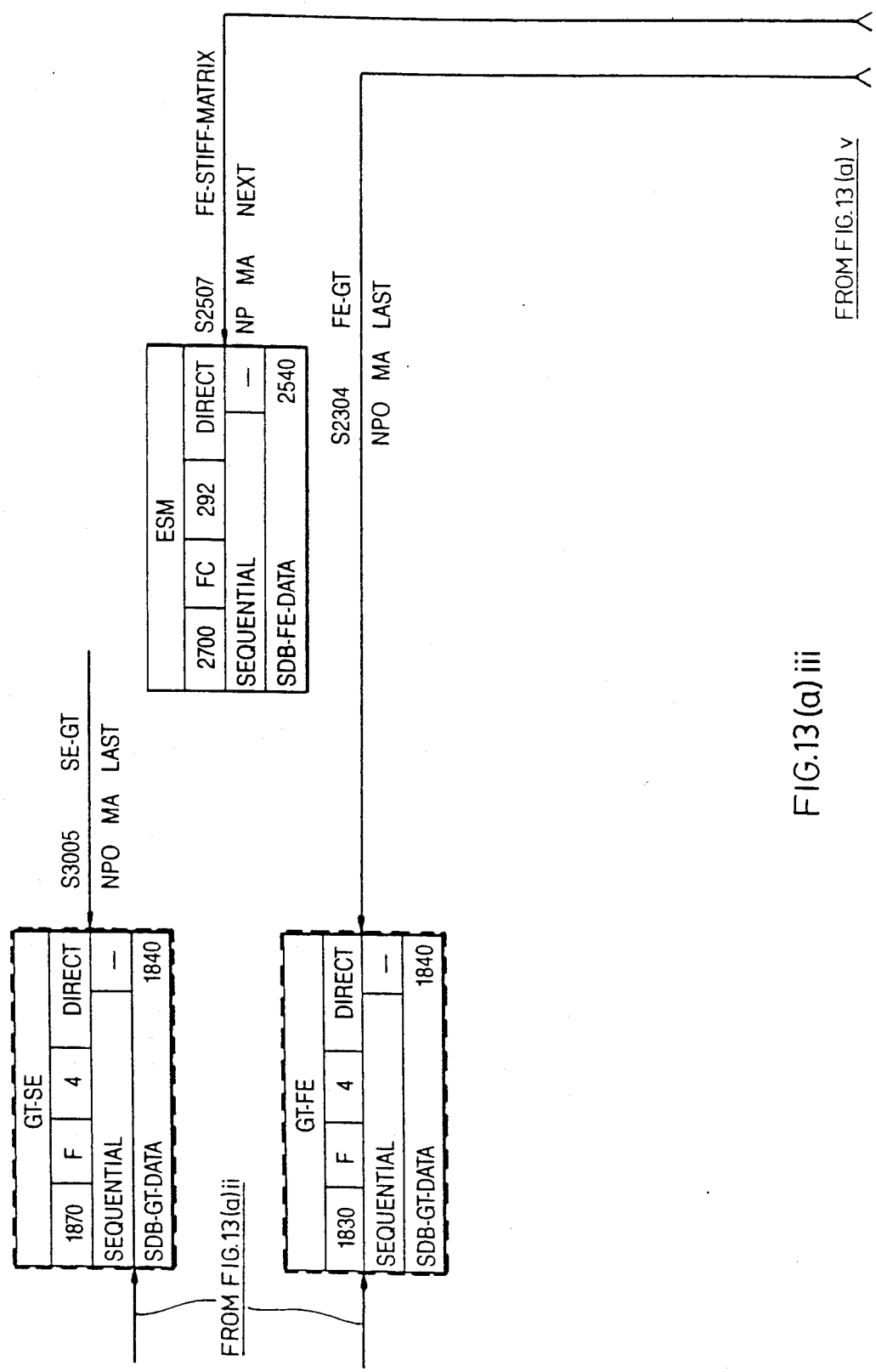
FIG.13(a)iii

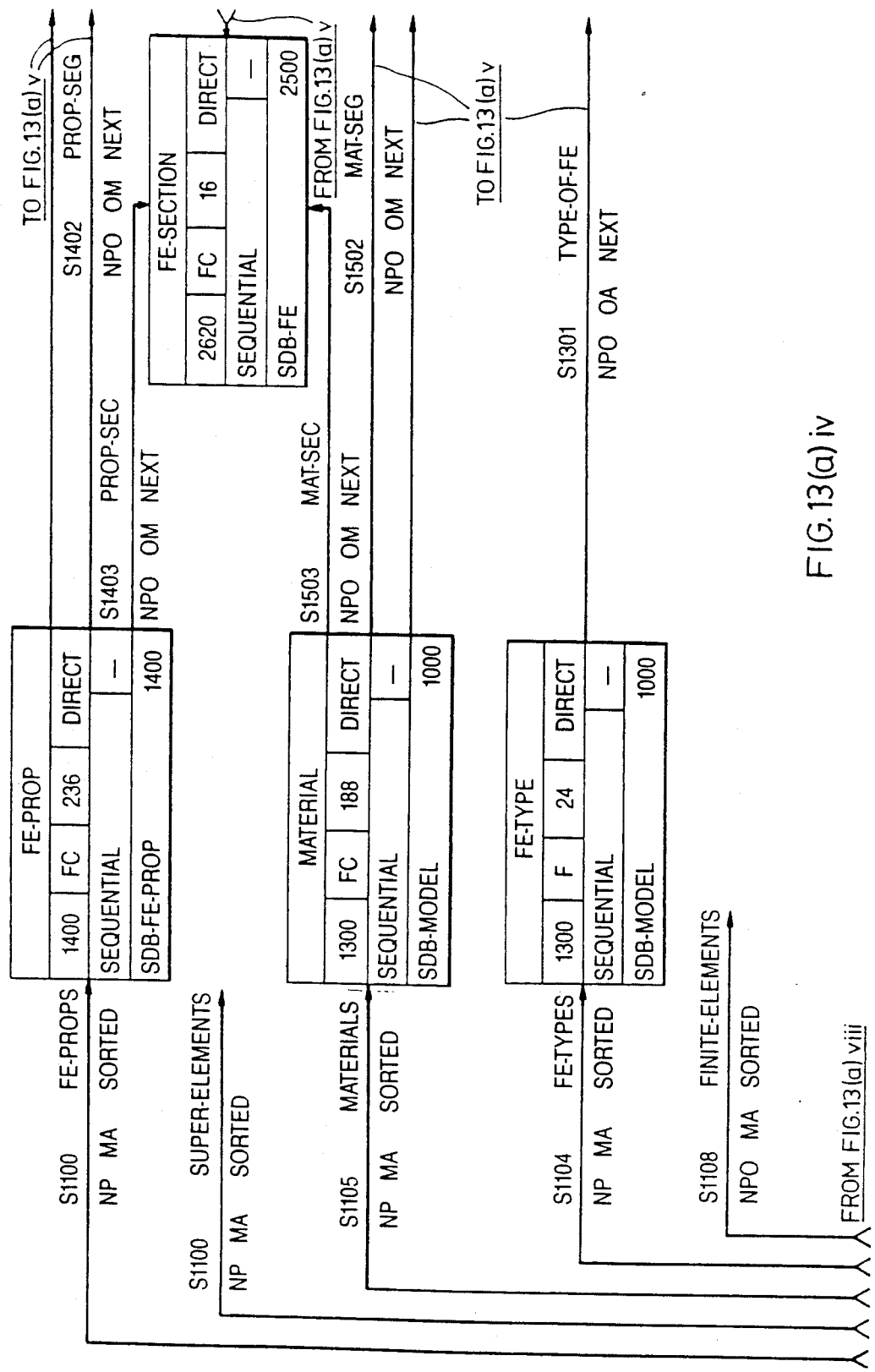
FIG.13(a)iv

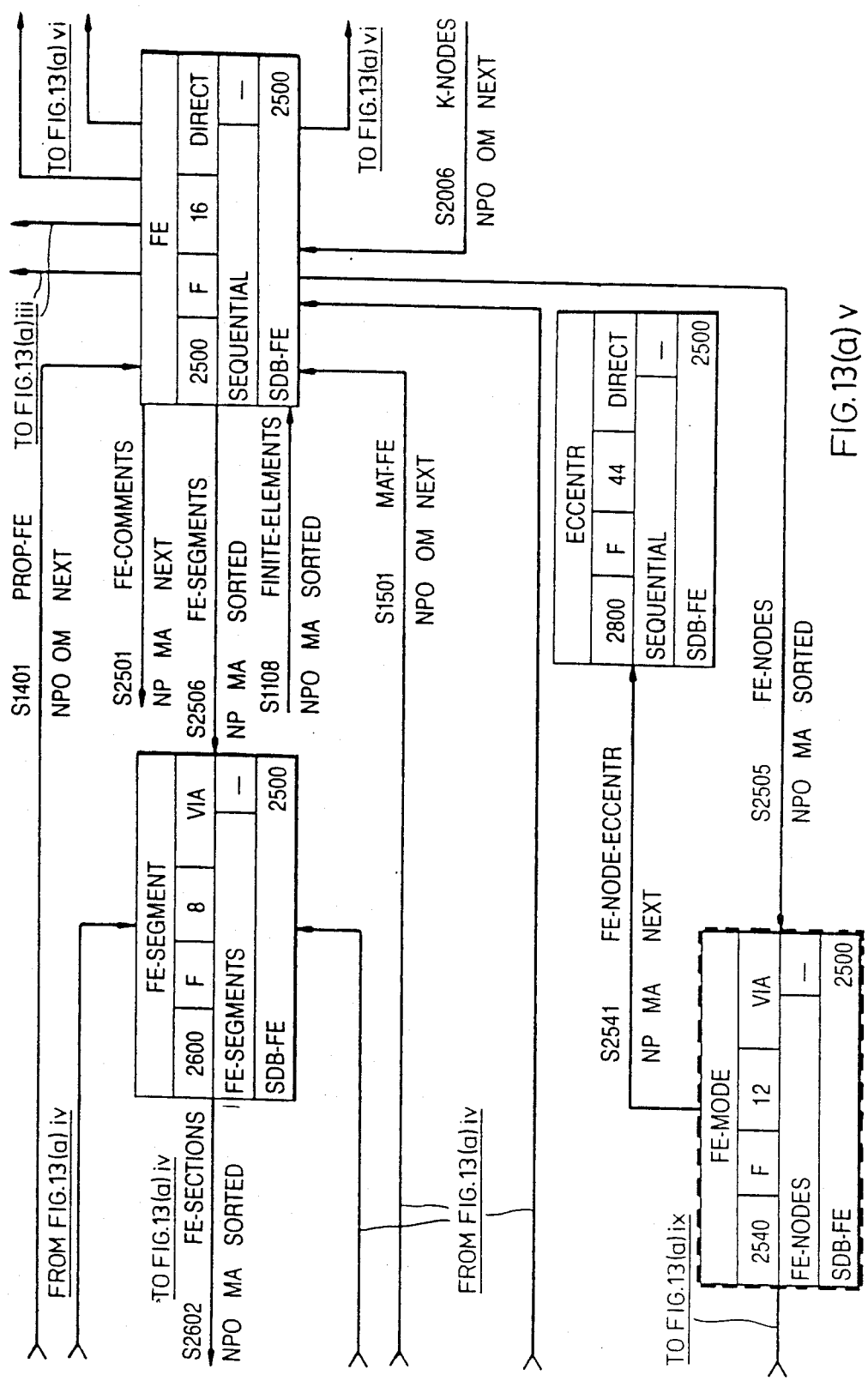

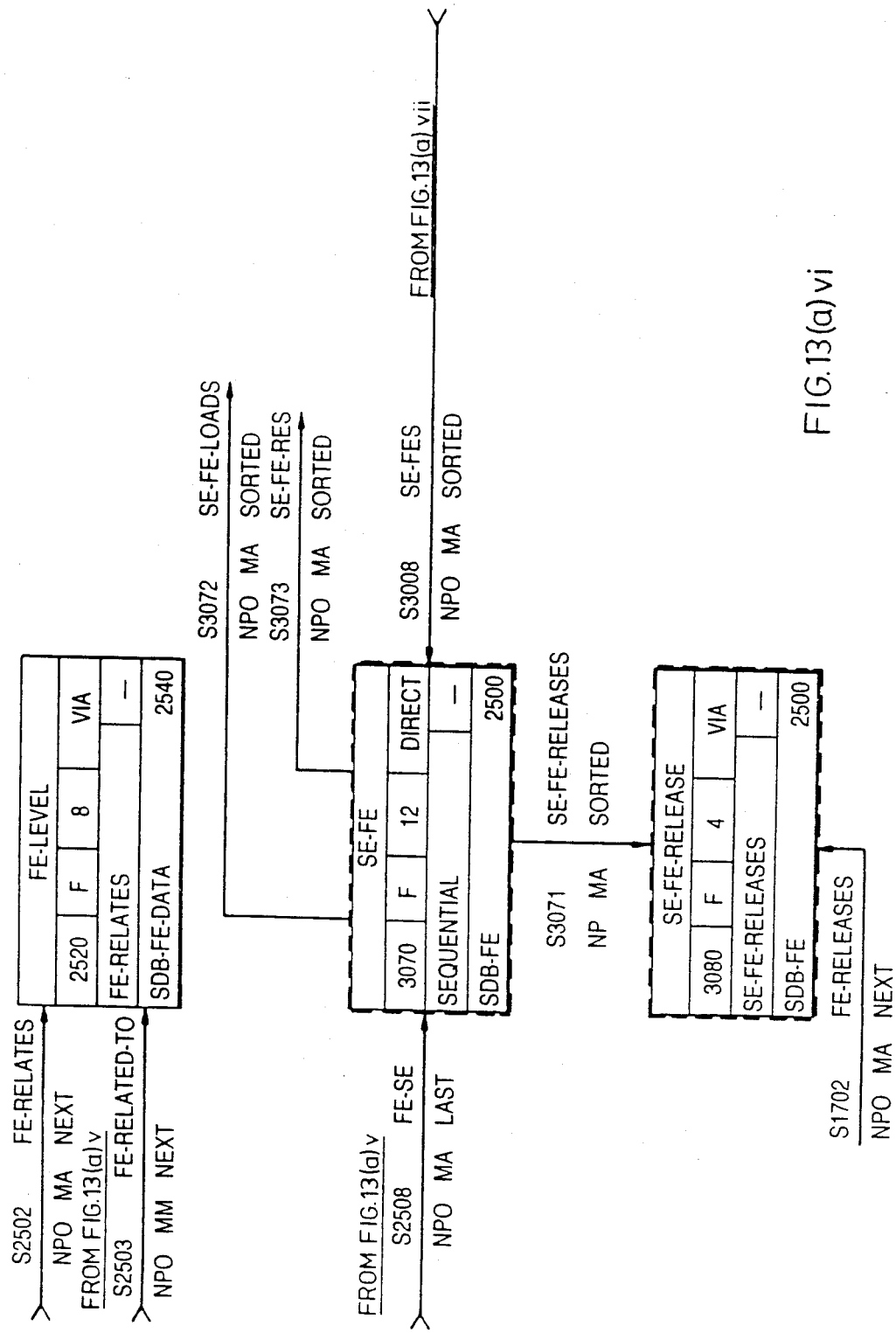
FIG.13(a)vi

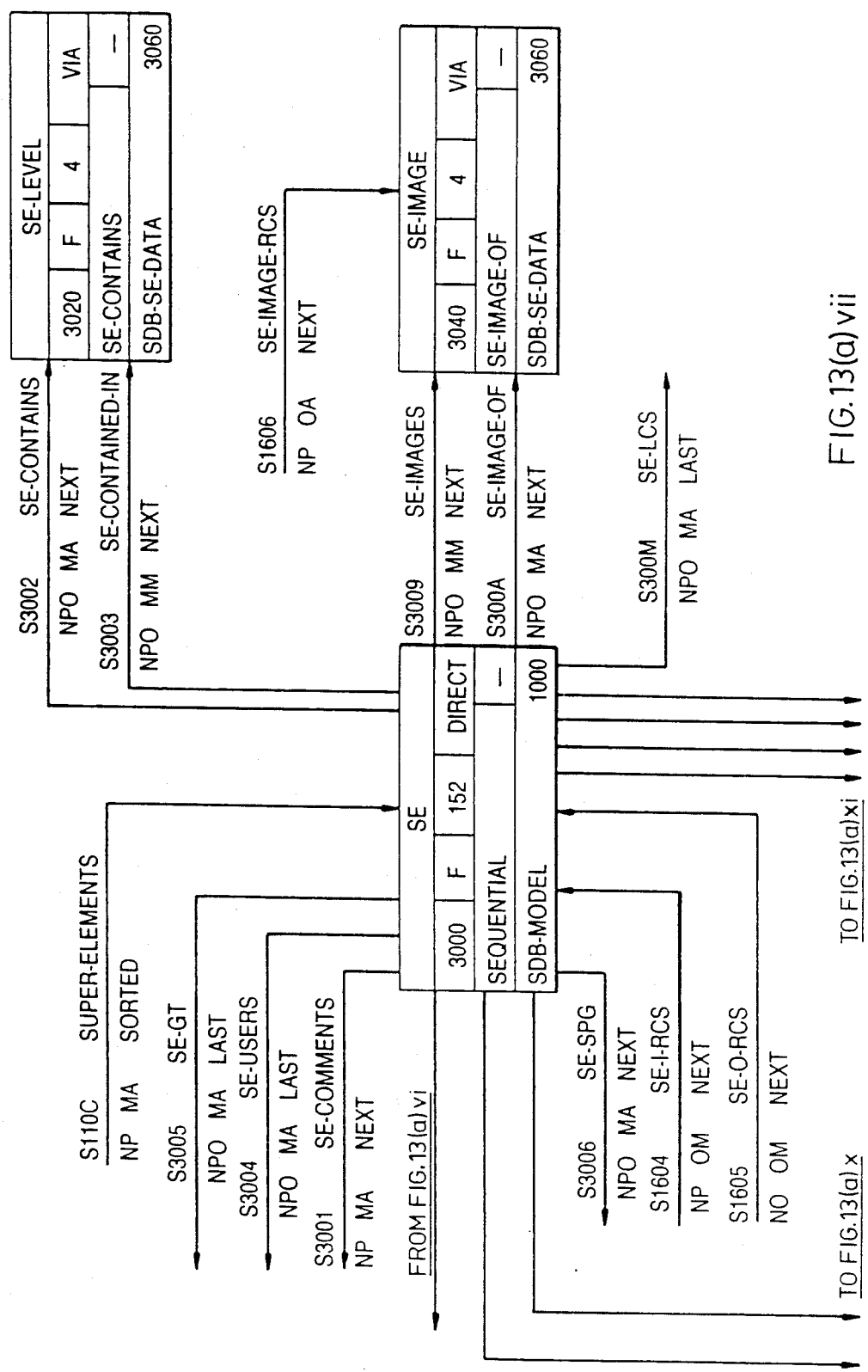
FIG.13(a)vii

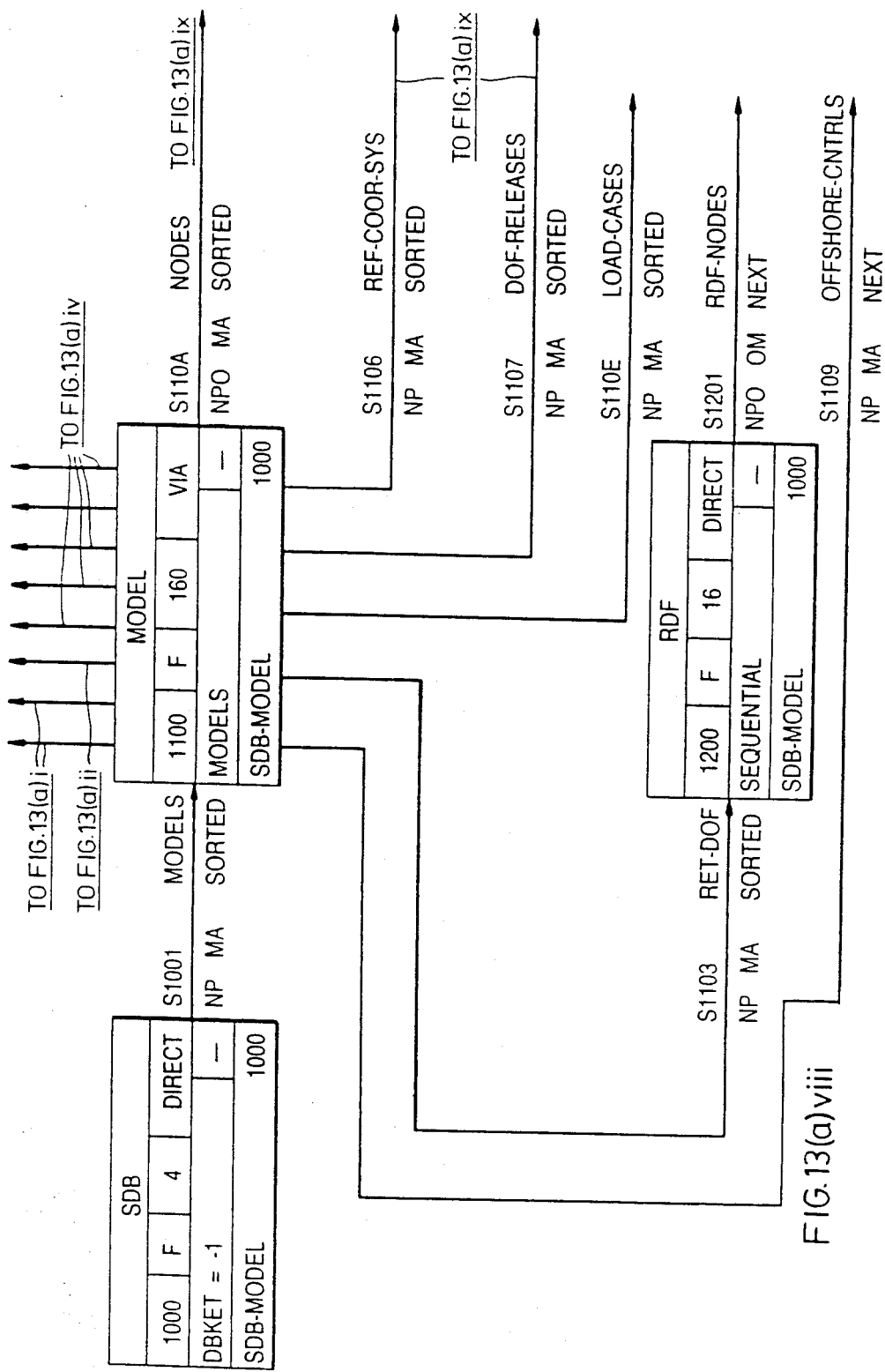
FIG.13(a)viii

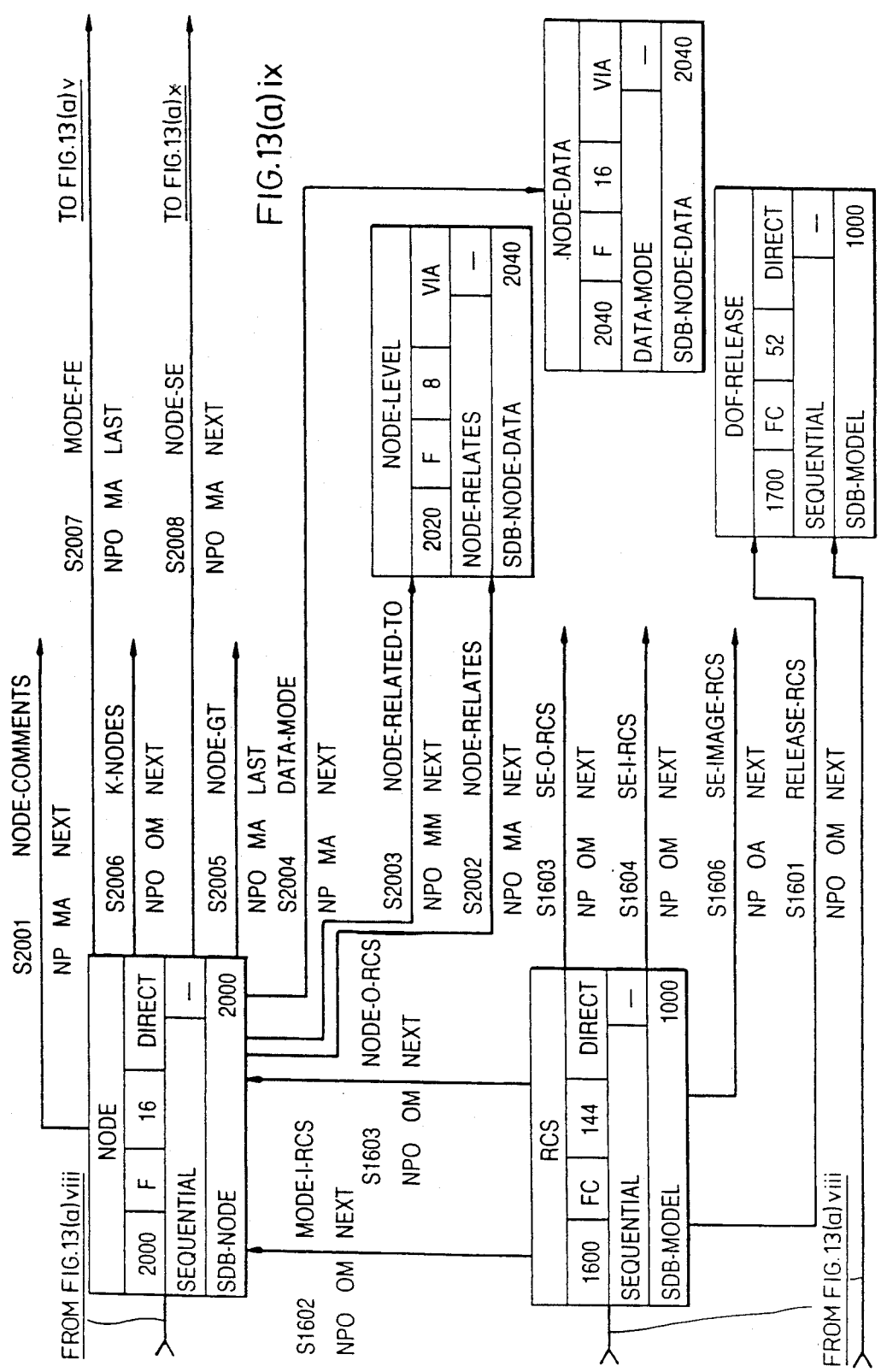

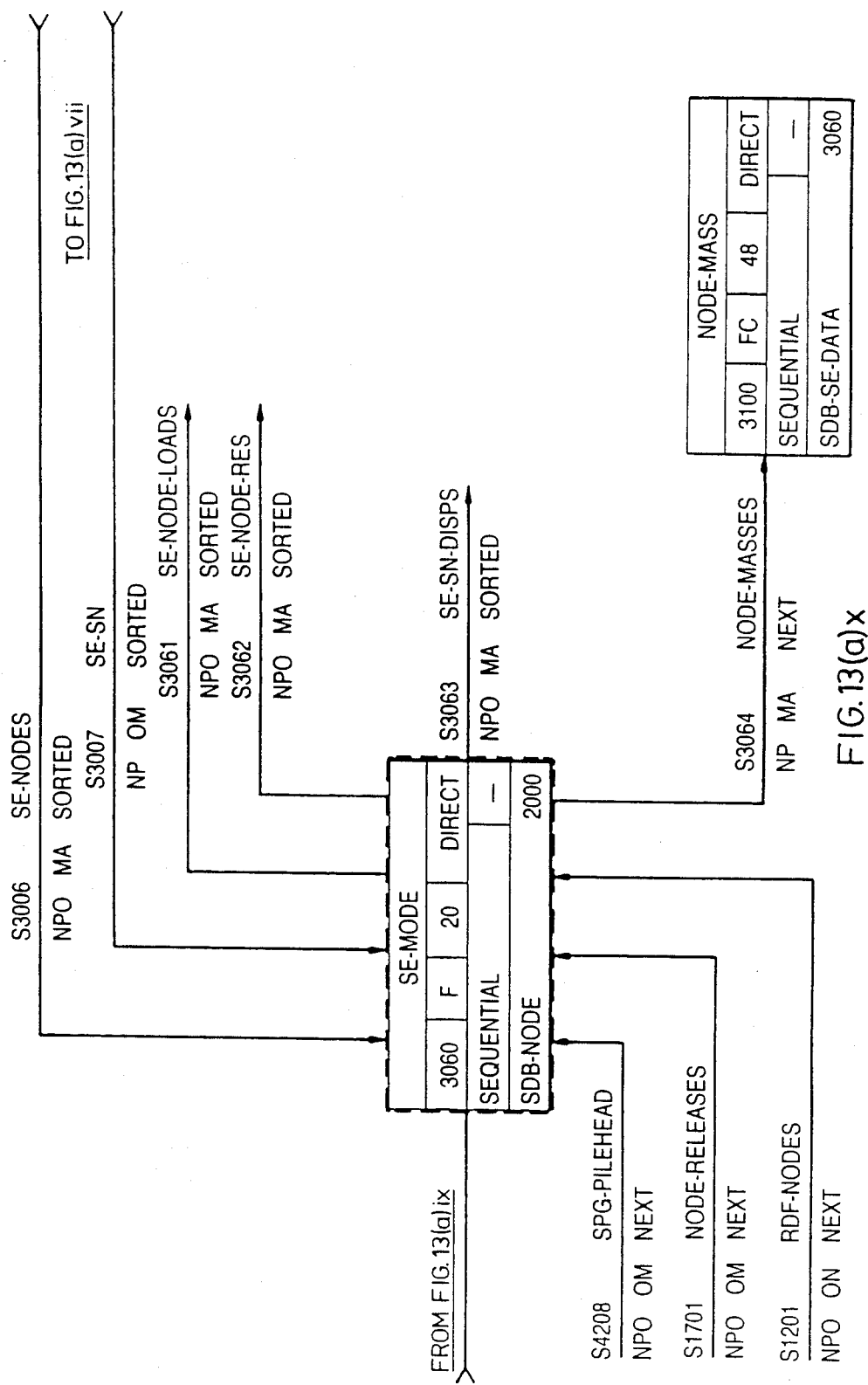

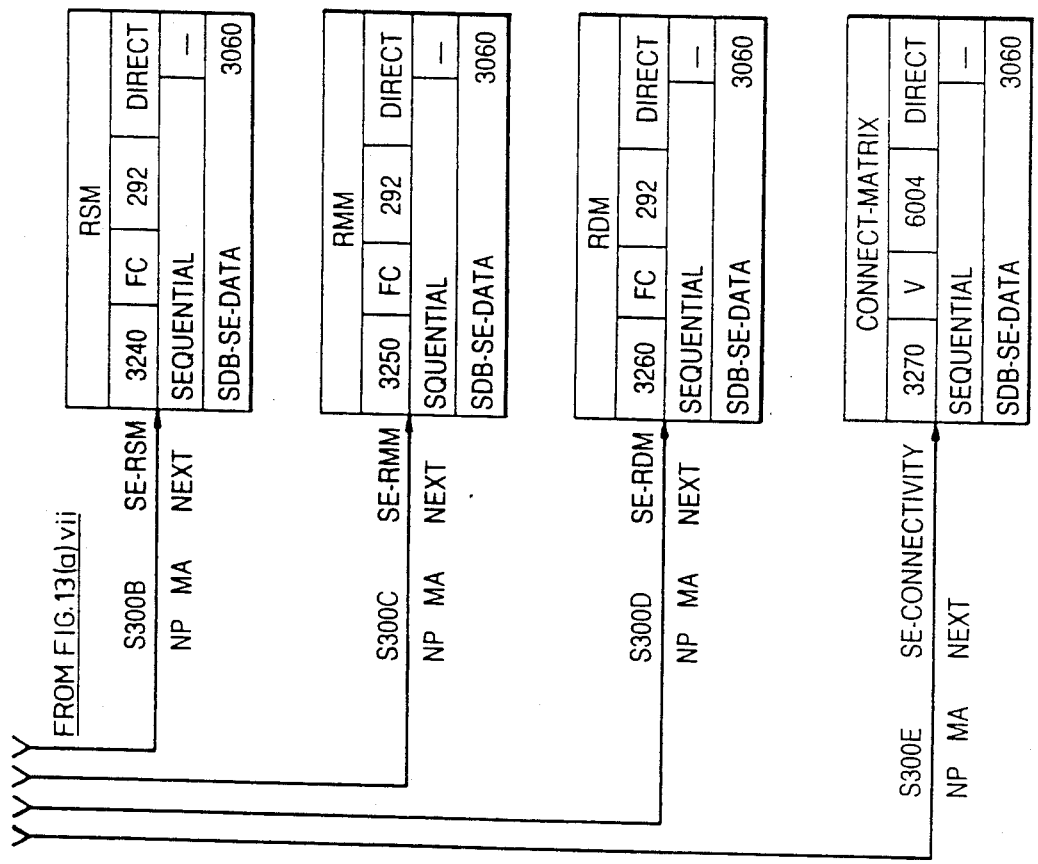
FIG. 13(a)xi

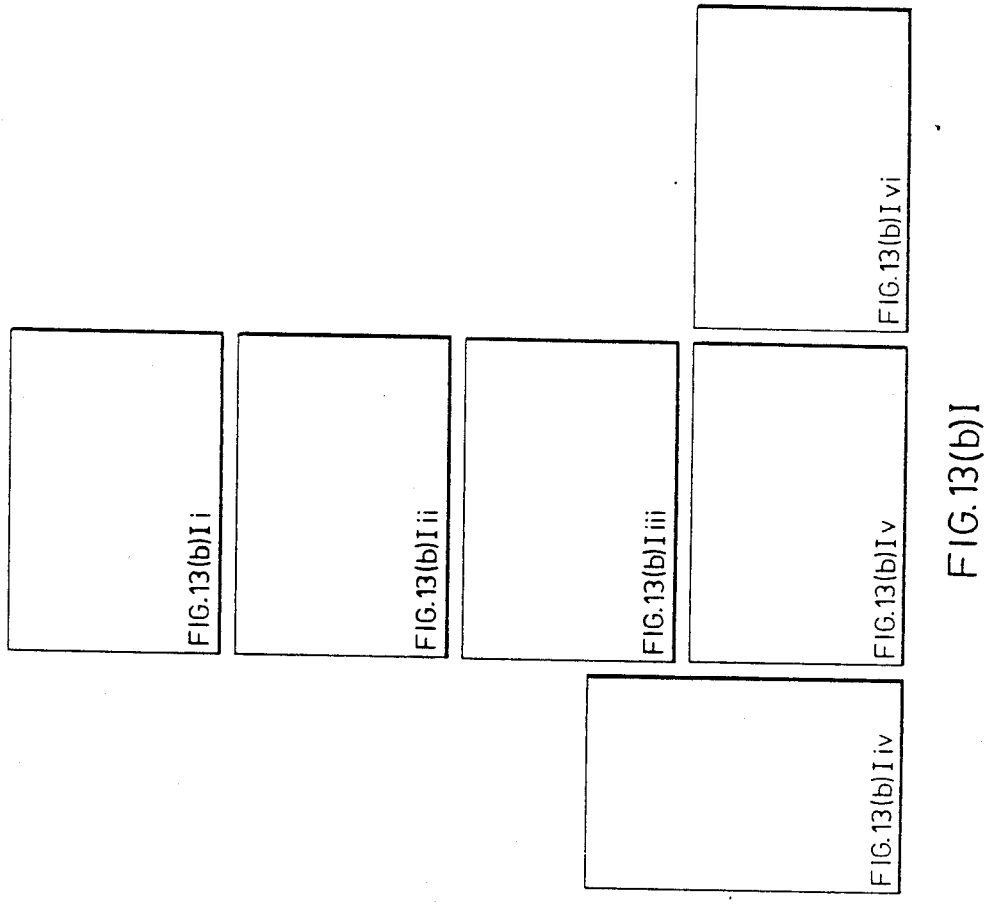

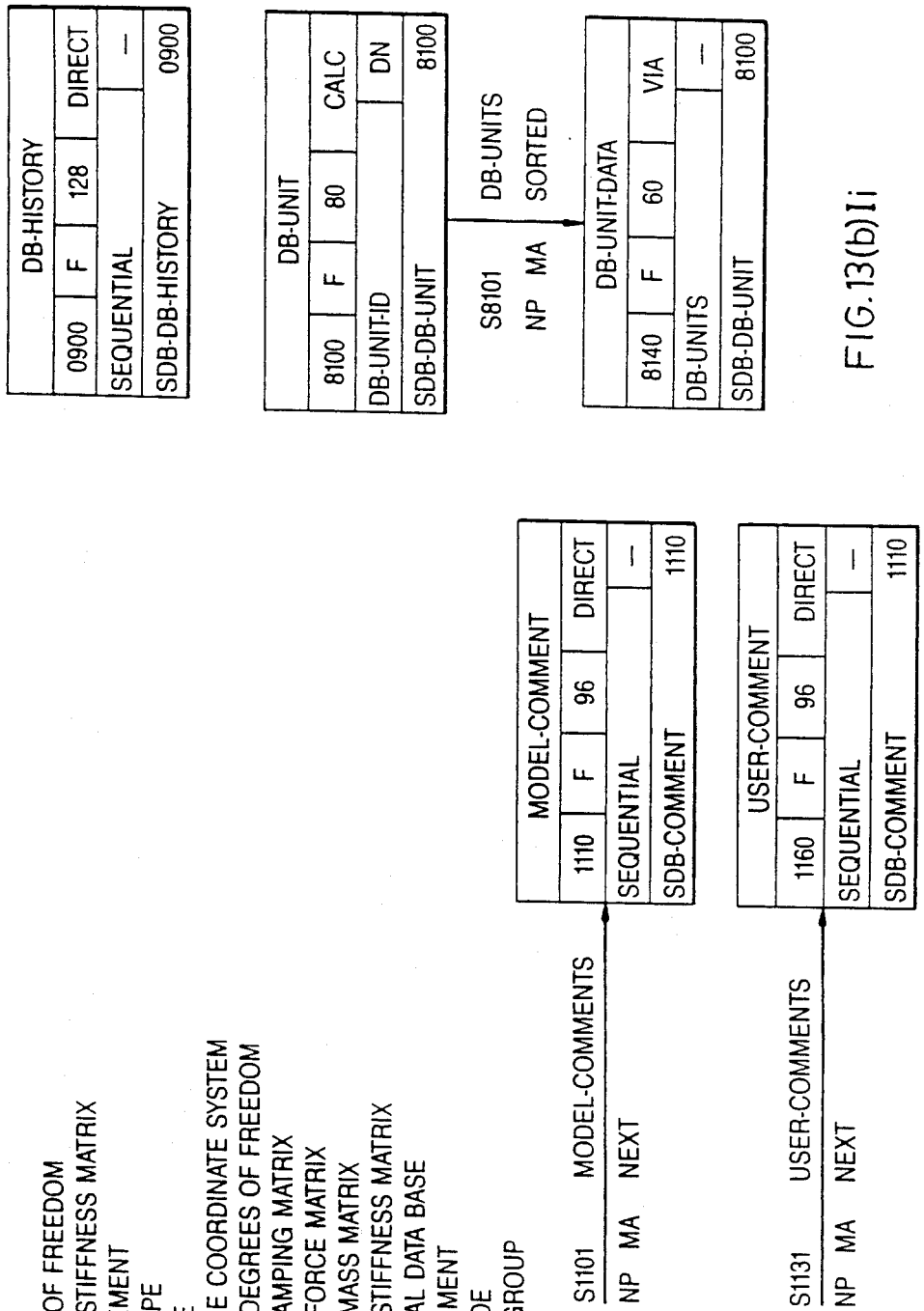
FIG.13(b)Ii

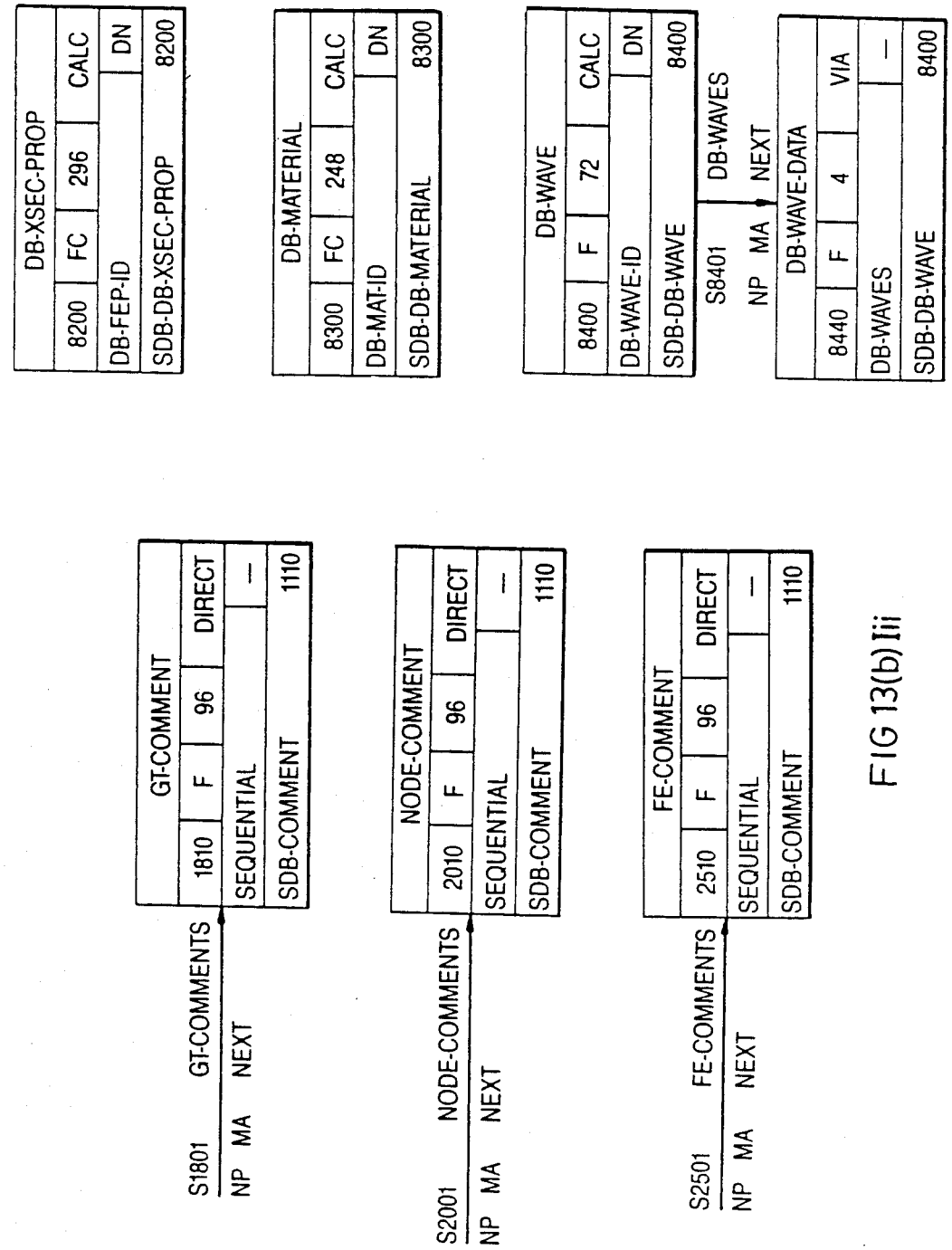
FIG 13(b)Iii

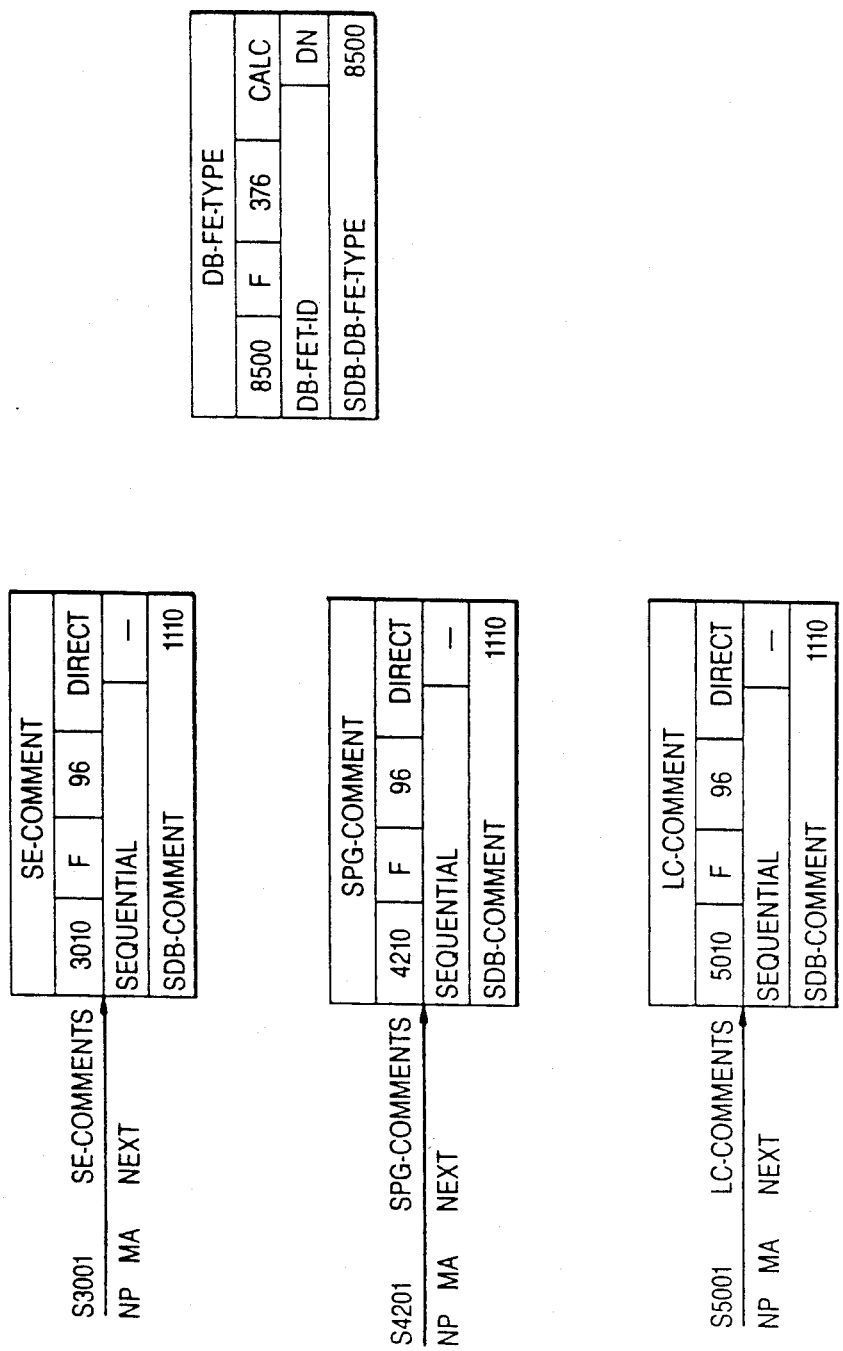
FIG 13(b)Iiii

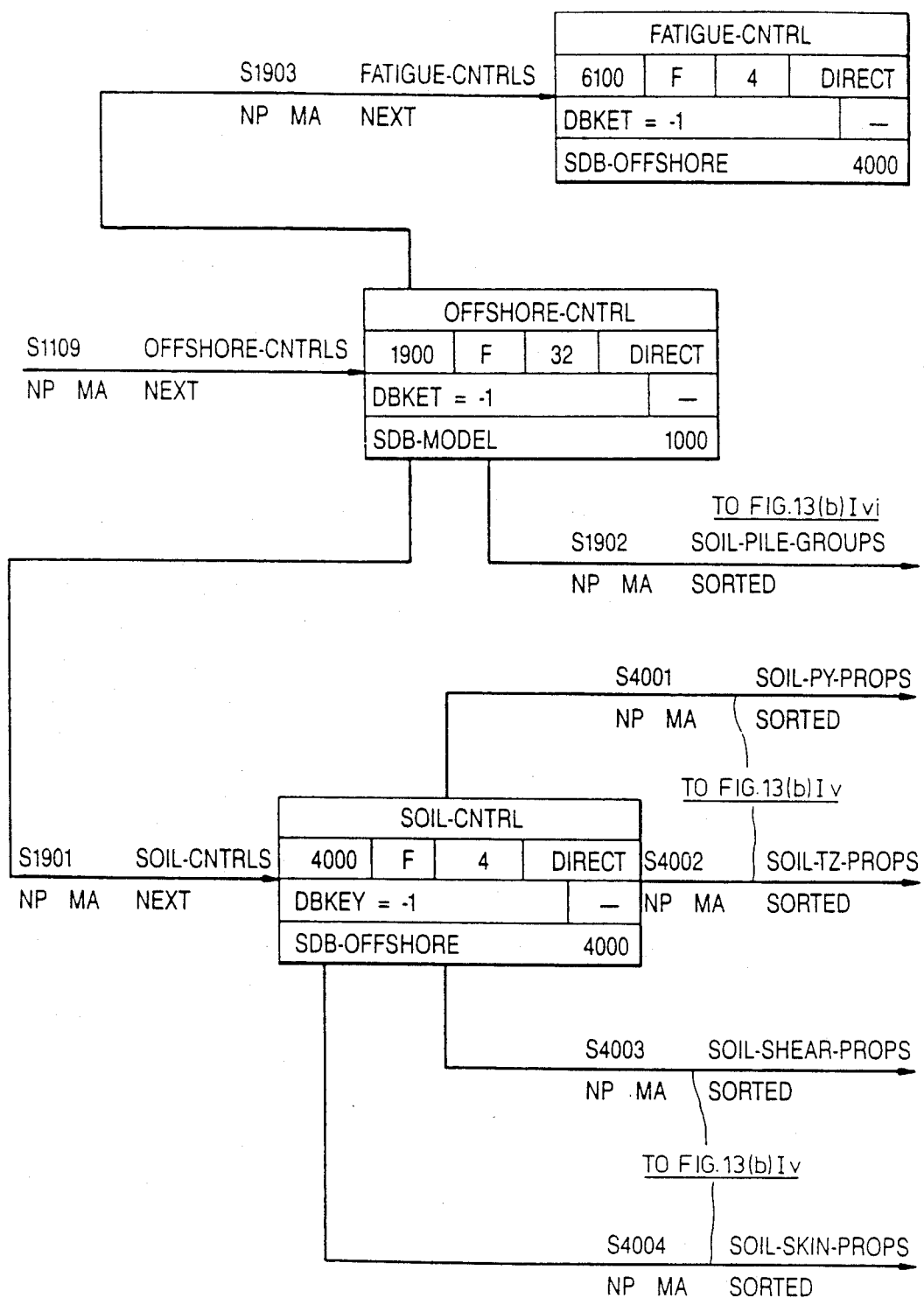
FIG. 13(b) I iv

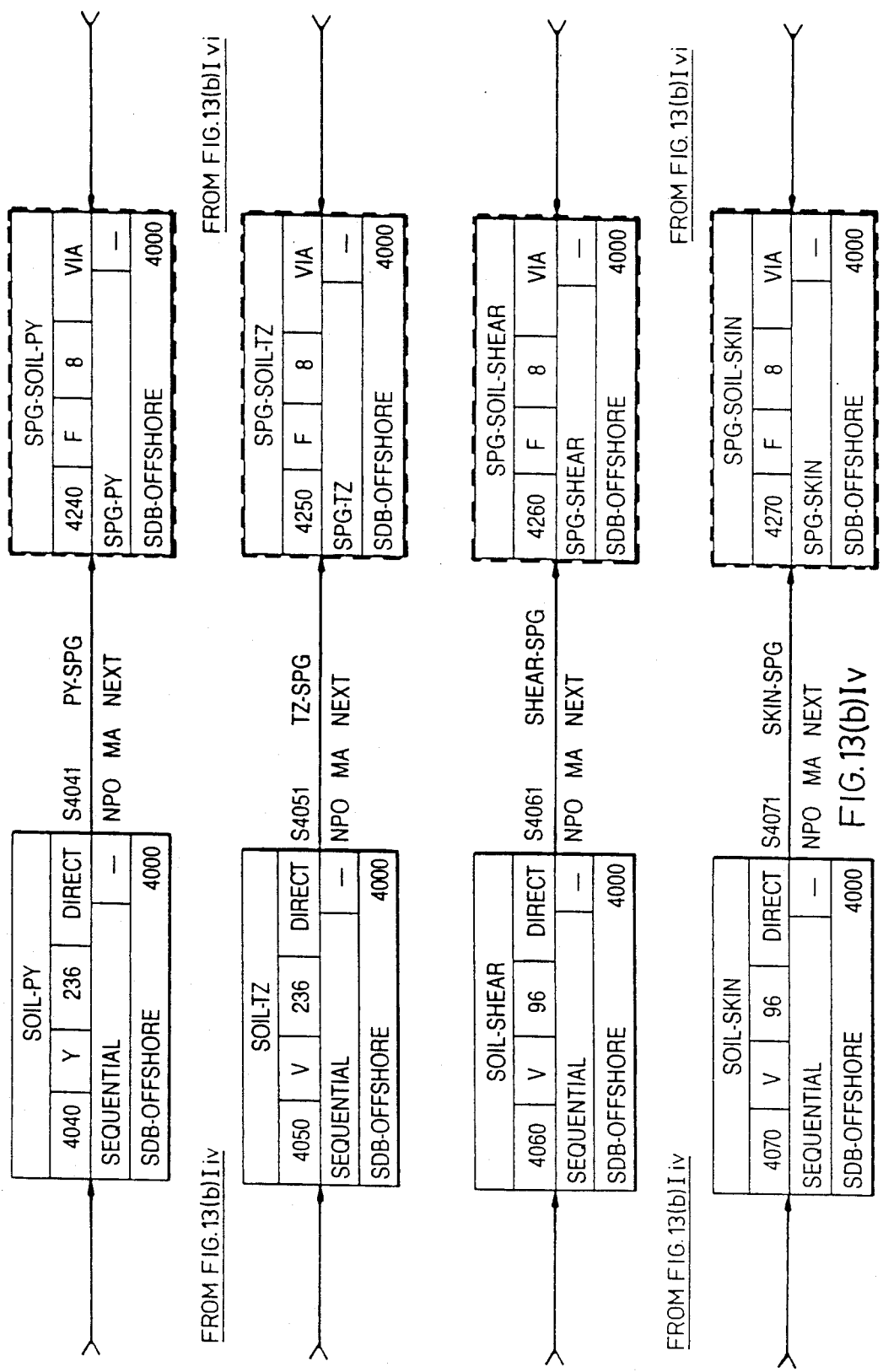
FIG.13(b)Iv

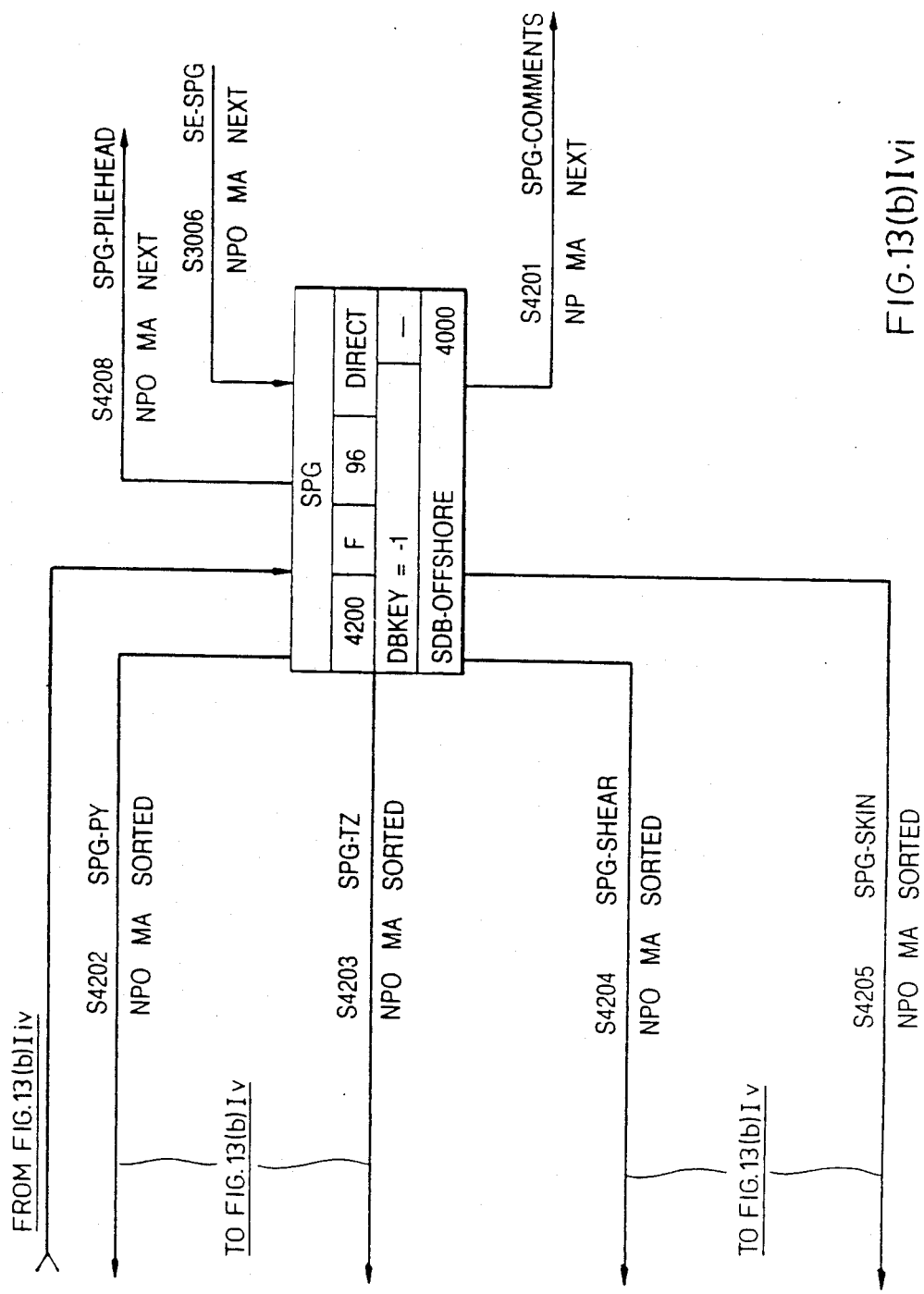
FIG.13(b)Ivi

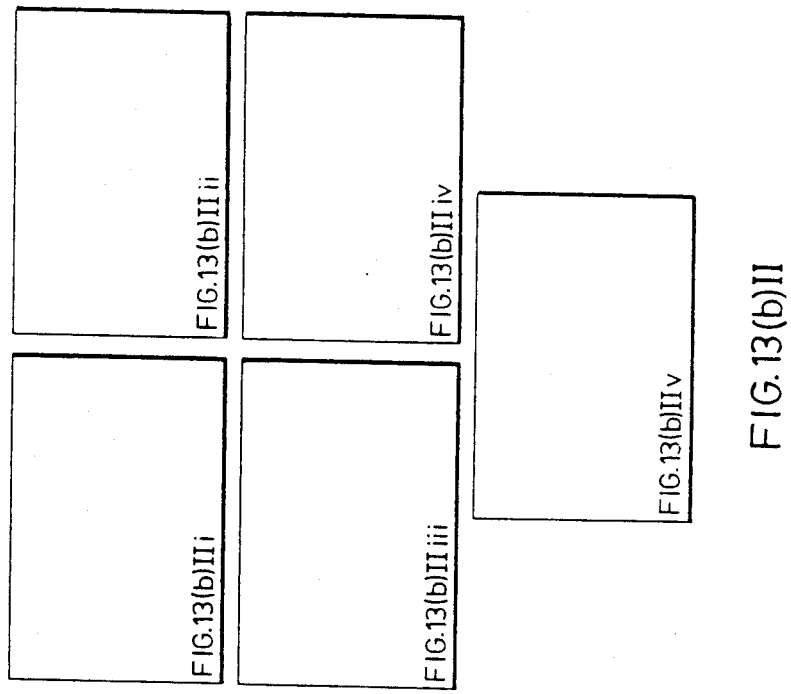

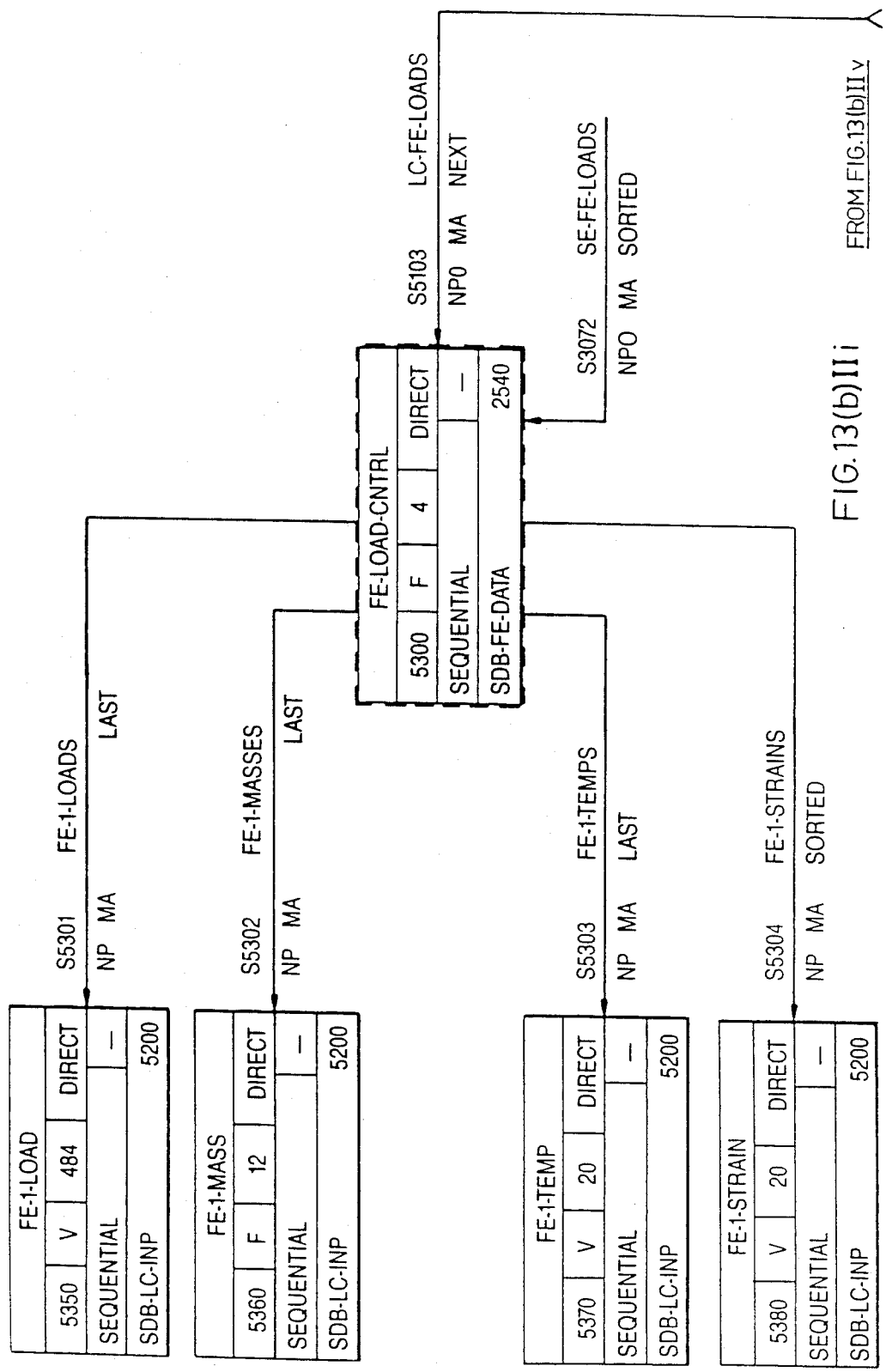

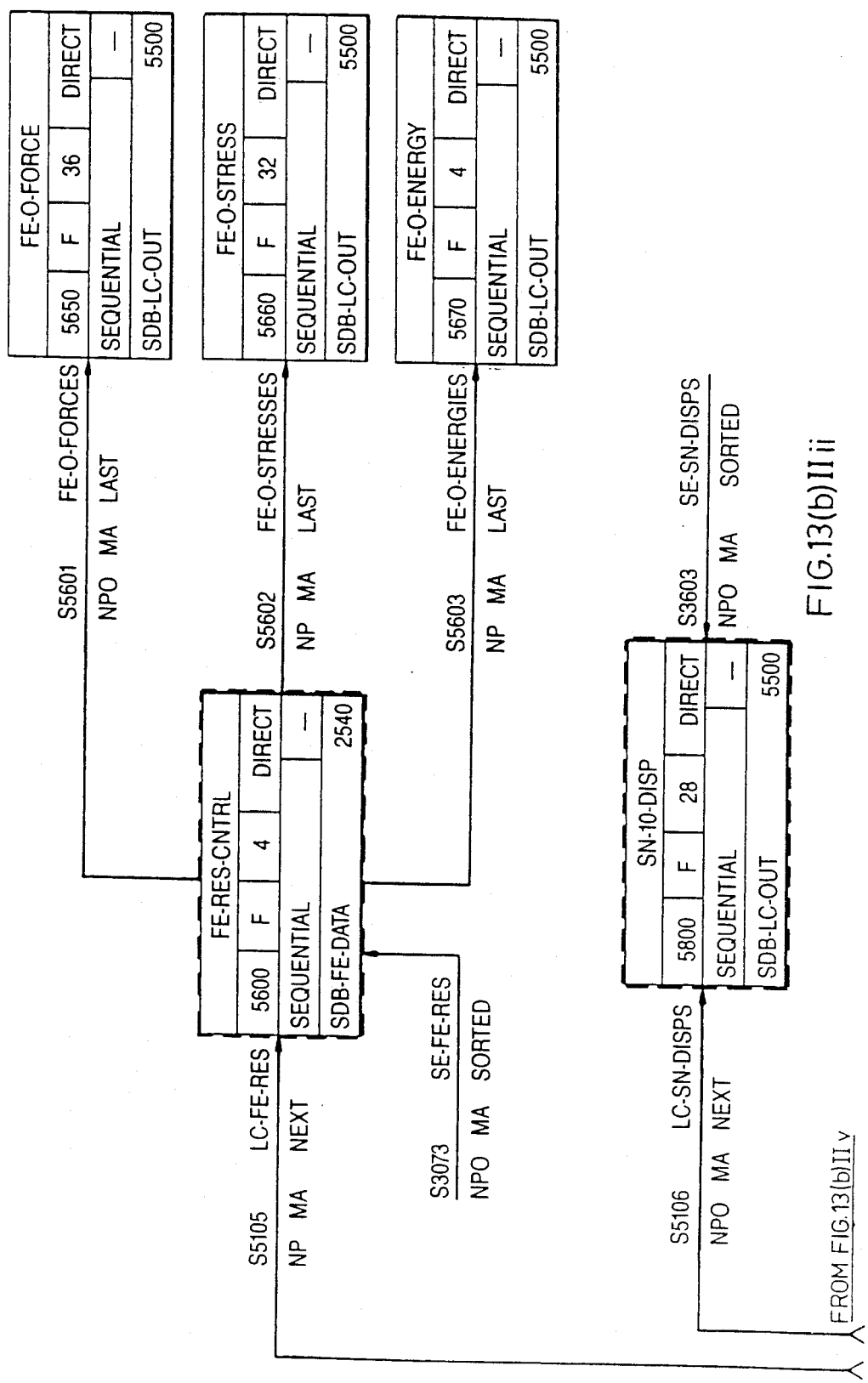
FIG.13(b)IIii

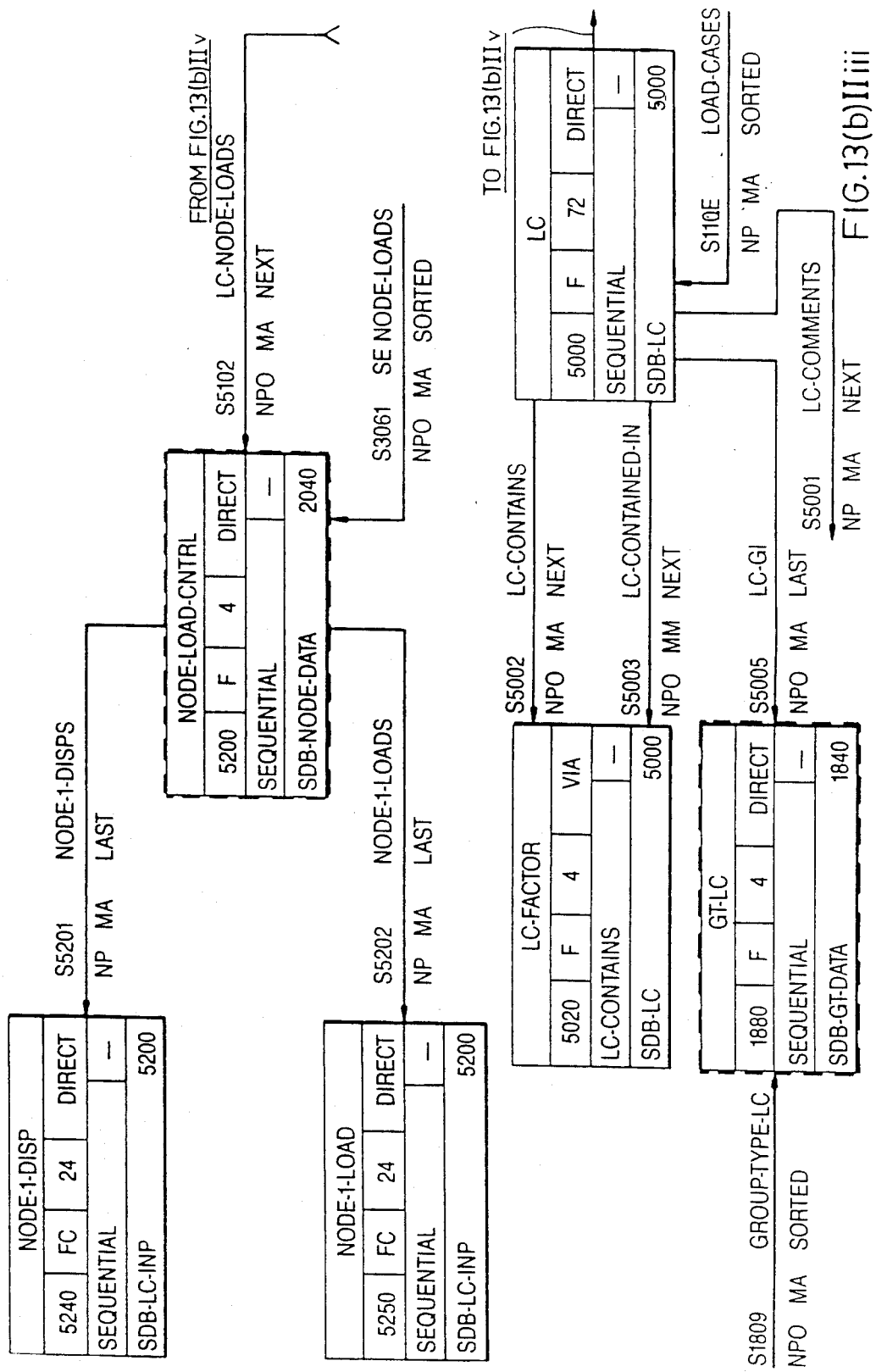
FIG.13(b)IIiii

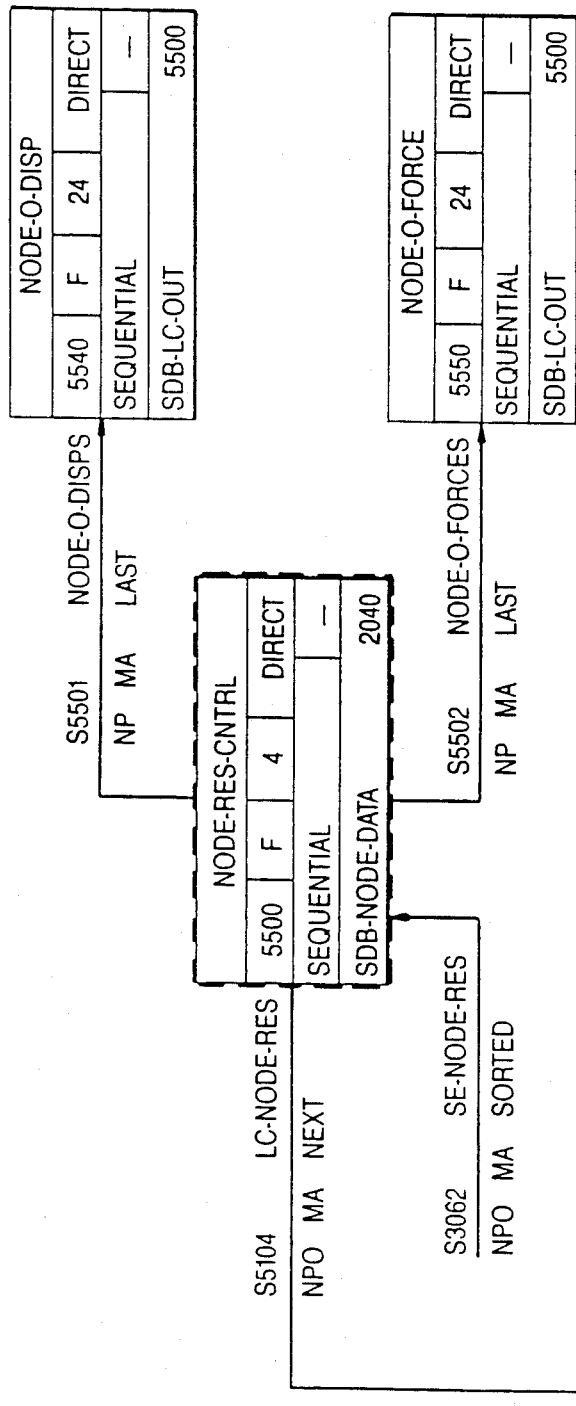
FIG.13(b)II iv

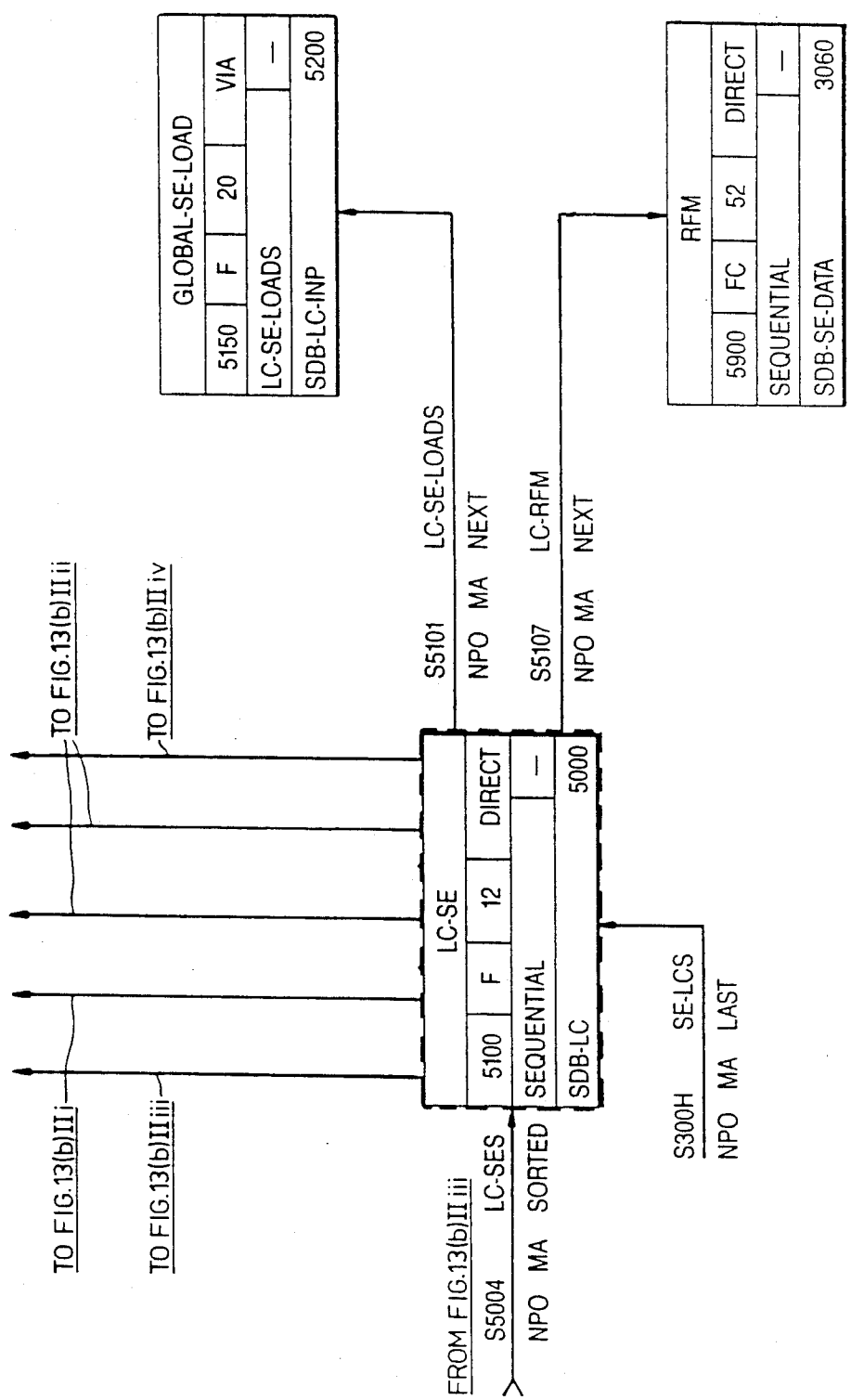
FIG.13(b)IIv

AUTOMATED DESIGN OF STRUCTURES USING A FINITE ELEMENT DATABASE

BACKGROUND OF THE INVENTION (1) Field of the Invention

The present invention is generally drawn to an automated design system for structures using a "Finite Element" database, which system has been particularly adapted to the design of offshore engineering structures. The database is controlled by IDMS, a general-purpose sophisticated database management control system.

(2) Description of the Prior Art

For many decades, the science of advanced stress analysis remained essentially stagnant. This was not due to a lack of theoretical understanding but because of the limitations of numerical computation. Thus, if the shape of the stressed workpiece or the system or applied load did not conform to a standard set of known solutions, the stress analyst had to then make it fit as best as he could by assuming some simplified shape or loading system that approximated the case at hand.

Nowadays, by using the Finite Element Method (FEM), stress analysts do not have to modify the problem to conform to available solutions. No matter how complex the shape or system of loads may be, the (FEM) treats a loaded structure as being built of numerous tiny connected substructures or elements as are shown in FIG. 8. Since these elements can be put together in virtually any fashion, they can be arranged in simulate exceedingly complex shapes. Thus, the (FEM) can be used to determine stresses for structural parts where no mathematically closed form solution exists.

The reliable accuracy of the (FEM) has rendered some of the most elegant experimental techniques, for example, two-dimensional photo-elasticity, obsolete. Another important aspect of the (FEM), for example, is that it is not limited to ordinary stress analysis. Non-linear material properties, plasticity and dynamics are all within the scope of the method. Furthermore, (FEM) can be applied to a broad class of problems called field problems, which include topics like electrical potential, heat flow, and nuclear fusion, to name but a few.

The idea of modelling complex structures as a collection of well-defined structural elements, such as BEAMS, PLANTS, and SHELLS, was put forward and received much attention. The (FEM), did not first appear until the 1960's. Computer systems available at that time did not provide the capacity required to model and solve practical design problems within the realistic time and cost restrictions of most production design schedules.

Most of the development activity centered not only on the generation of large-scale structural computer programs as NASTRAN, but also on the development of sophisticated numerical methods for solving large sets of linear simultaneous equations.

The second milestone in the development of the (FEM) occurred in the mid-sixties with the advent of third generation computers. For the first time the computer power required to solve complex engineering problems became available. Time-sharing computers, which allowed for more efficient interaction with the stress analyst, and faster solution of engineering design problems were also introduced.

In its simplest form the FEM process is done according to the following steps:

The structural part is divided into discrete "Finite Elements", selected from the available library of fully developed and tested elements as shown in FIG. 8.

These "Finite Elements" are assumed to be connected together at discrete points called Nodes. Each Node usually has 6 degrees of freedom for its possible displacements: 3 translations and 3 rotations.

The position of these Nodes in space is defined by specifying their coordinates relative to some reference point using a rectangular, cylindrical or spherical reference coordinate system.

For each "Finite Element" a matrix, called the B matrix, is constructed from its geometrical properties.

For each "Finite Element" another matrix, called the D matrix, is constructed from the elastic properties of the materials used.

For each "Finite Element", a stiffness matrix k, is constructed by applying simple mathematical transformations to both the B and D matrices; k is always symmetric and consists of $n^2$ submatrices, where n is the number of Nodes in the "Finite Element". Furthermore, each submatrix in k is of order d, where d is the number of degrees of freedom of the relevant Node.

A global stiffness matrix K is then constructed using the individual matrices k, such that displacements are compatible at each common Node.

The loads applied to the structure are then represented by equivalent loads applied on the relevant Nodes of the Finite Element Model. This results in the set of simultaneous equations $$Kr = R, \quad (1)$$

where K is the global stiffness matrix, r is the displacement vector, and R is the load vector.

K is always symmetric, thus only it's upper or lower triangle need be stored or processed; it consists of $N^2$ submatrices, where N is the total number of Nodes in the "Finite Element" Model. As with the "Finite Element" stiffness matrix k, each submatrix in K is of order d.

Some Nodes are usually constrained against movement, in order to support the loaded structure. To take account of this, the appropriate degrees of freedoms in the relevant Nodes are set to zero.

The above equations, i.e. (1), are then solved, giving the final displacements for all of the degrees of freedoms of the Nodes in the Model.

The state of strain, and hence the state of stress, in each "Finite Element" is then fully obtained from the displacements of each "Finite Element".

The global stiffness matrix K may refer to more degrees of freedom than is required for the problem in hand. In this case, a technique called static condensation can be used to condense K by eliminating the unwanted degrees of freedom; these are usually called internal or dependent degrees of freedom.

The resulting condensed or reduced stiffness matrix, K', expresses the stiffness of the structure in terms of the reduced number of degrees of freedom chosen; these are usually referred to as external, boundary or independent degrees of freedom. Thus, static condensation is essentially a process of partial elimination of the unknown internal displacements. The resulting reduced stiffness equations may be written as $$K'r = R', \qquad (2)$$

where K' is the reduced stiffness matrix, r' is the reduced displacement vector, and R' is the reduced load vector. Static condensation is essentially the process of computing K' and R', as follows:

Assemble the stiffness equations.

Partition the coefficient matrix of these equations into dependent and independent submatrices corresponding to the set of dependent and independent degrees of freedom.

Compute K'. This process usually involves a matrix inversion (or equivalent), which, for large problems, may require considerable computer resources.

By way of example, the simply-supported, loaded, continuous beam, as shown in FIG. 7, which consists of several spans, each having it's own cross-sectional properties, may be modelled as an equivalent system at the two extreme Nodes only, using static condensation. The resulting reduced stiffness matrix K' may be viewed as the equivalent beam stiffness matrix in terms of its end displacements and rotations, and similarly, the reduced load vector R' as the equivalent fixed end beam forces and moments of the applied load.

The static condensation method can be applied to condense any structural Model containing any number of Nodes. Although there is a lot of similarity between K' and k, there are two basic differences:

For a given "Finite Element" type, the order of k is fixed and predefined by the total number of degrees of freedom of the "Finite Element". On the other hand, the order of K' is variable and is equal to SN, where SN is the total number of independent degrees of freedom chosen.

The k matrix is automatically generated by the "Finite Element" solver used (either in close form or by numerical integration), whereas K' is obtained by static condensation. The similarly between k and K' suggests that K' may be viewed as the stiffness matrix of some Super Finite Element, which has no particular geometrical shape and whose Nodes are those designated as independent. This idea of a Super Finite Element has led to the more common name of "Super Element", and to the independent Nodes being called Super Nodes.

Once a solver is used to compute the independent displacement vector r', it is then possible to re-apply these displacements as boundary conditions to the Super Element Super Nodes and solve for the internal (i.e. dependent) displacements.

Finally, simple (or single-level) Super Elements are those consisting of the basic "Finite Elements" known to the solver, which is being used to perform the static condensation. Nested (or multi-level) Super Elements, however, may consist of some of the basic "Finite Elements", together with one or more other Super Elements at the time of static condensation. Usually, there is no limit to the number of nesting levels, and the only problem is keeping track of the data and matrices in the forward pass (i.e. static condensation) and the backward pass (recovery of Super Element internal results).

Turning to very particular structures, namely offshore platforms, we see that they must be structurally adequate for operational and environmental loading, practical to construct, and be cost effective. The selection of a configuration is based on functional requirements and methods of installation. This is especially true for structures situated in extreme water depths, such as the North Sea. Once the configuration has been selected by the design engineer, trial member sizes (e.g. tube diameter, thickness and length) must be assigned. These trial sizes are essentially educated guesses based on operational loads developed from equipment and materials layout, and estimated environmental loads. Estimates of the environmental loads are usually derived from experience with previous designs having similar environmental criteria. When assigning these trial sizes, consideration is given to the magnitude of the anticipated member forces, material used, local and overall member instability, overall buoyancy requirements, and hydrostatic considerations.

The horizontal and vertical forces exerted by wave action on individual members of the structure are calculated using the well known "Morison" equation, in conjunction with any of the available wave theories. These forces are functions of wave height, wave period, water depth and elevation above the mudline. In addition, the "Morison" equation includes empirical coefficients which depend on the size and shape of the member under consideration, and on the wave theory used.

In evaluating wave loads, the crest of the wave must be positioned relative to the structure, so that the loads have their maximum effect. Wind loads on the structure are developed using standard air flow theory. Sustained wind velocities are normally used for the computation of overall wind loads on the structure, but individual structural elements must be designed for instantaneous gusts.

If the structure is to be installed in very cold or seismically active regions, it may be subject to ice or earthquake loads, in which case more elaborate design and analysis procedures are used.

Once environmental loads are determined, they are combined with operational loads, and an estimate is made of the resulting pile mudline moments and axial forces. These approximate moments and forces are used in conjunction with foundation data to set trial values for pile penetration and make-up.

The design of major structural components of the superstructure and jacket is based on member forces determined in a 3-dimensional "Finite Element" analysis, which yields the resulting internal element forces, Node displacements and support reactions.

The pile analysis procedure employs a beam-column analysis using a finite difference technique to account for the non-linearity of lateral deflection of the pile and the natural variations in soil profiles along the length of the pile. The design penetration is based on the capacity of the soil to absorb the maximum design pile load with apropriate safety factors. Furthermore, to ensure that the pile can be driven to the design penetration without damage, pile driveability studies are performed for the available hammers.

Before the design solution of either the 3-dimensional "Finite Element" analysis of the superstructure and jacket, or the beam-column analysis of the piling can be considered finished, it is necessary to determine compatible conditions at the pilehead-structure interface. These equilibrium conditions are usually obtained using an interaction analysis procedure which yields the combined response of the linear structure and it's non-linear soil-pile foundation for any imposed static load condition.

The equilibrium conditions determined from the interaction analysis are now imposed on the structural Model in combination with appropriate design loads, and a static analysis is performed. The internal member forces determined in this analysis are employed to check the stress levels in the members. The stresses are compared to allowable stresses, as set forth in the design basis, and members are resized accordingly. Submerged members of the jacket must be checked for hoop stresses imposed by the hydrostatic head acting alone or in conjunction with axial stresses from the design cycle. If member resizing involves changes in outside diameter for a significant number of members, the overall waveload on the structure can be considerably different from that used to analyze the structure. In this case, the environmental loads must be determined based on the revised member sizes and the subsequent design steps must be performed again. The experienced structure designer can usually avoid this complication by the judicious assignment of trial member sizes. If the environmental loads are not significantly affected by the resizing of the structural members, the revised pile design can proceed using the boundary conditions from the interaction analysis. When dynamics do not become a consideration, this phase constitutes the final foundation design. However, deep water structures invariably require detailed assessment of response to dynamic loadings which necessitates further analysis of the foundation.

After the nominal sizes for main structural members have been finalized, it is necessary to design the connections of these members in accordance with the associated stress distribution. Geometric studies must be made to define joint layouts and to eliminate joints which might prove difficult to fabricate. At the intersection of tubular members, the chords or through members must be analyzed for punching shear stresses. Since the controlling stress levels at many of these joints are caused by loads which are cyclic in nature, due consideration must be given to high and low cycle fatigue. For some structures, the design of these joints may require special analysis to assess the cumulative fatigue damage, including consideration of dynamic amplification of stress levels for structures with significant dynamic response. Complex joints require detailed stress analysis to determine the appropriate stress concentration factors for use in a fatigue analysis and the correct distribution of loads. These joints are studid using "Finite Element" analysis.

Upon completion of the structural analysis and the sizing of the main members of the structure, the design of the deck and jacket detail steel begins and the final routing of piping, electrical, and instrumentation systems required on the structure can be completed. The design of these detail steel items and auxiliary systems are carefully coordinated with the layout of equipment and materials for drilling and production. Also, prior to designing the deck section, a lifting study must be carried out to ensure that the weight of the deck section with associated piping and equipment is within the lifting capacity of the derrick barge to be used on installation. To meet these criteria, the deck must often be fabricated in multiple sections and a lifting sequence is prescribed.

Once the jacket is fully designed, marine analysis can be performed for both towing and installation of the fabricated jacket. In the towing analysis, the stability and strength of the launch barge/jacket assembly is evaluated for environmental conditions due to wind, waves, and current expected to occur along the towing route. Forces caused by the barge response to these expected environmental conditions are used to design tiedown braces for fixing the jacket to the barge and to verify the structural integrity of the barge/jacket during tow. Towing analysis are also performed for the deck structure, piles, and any structure-related equipment that must be towed to the installation site.

When the barge is on location, the jacket is launched and then maneuvered from the horizontal free-floating position to a vertical orientation on the bottom. An installation analysis computes the forces on the barge and jacket during launch and simulates the behavior of the jacket from launch through upending.

Depending on the function of the offshore structure, pipelines may need to be installed for carrying the products to or from the structure. Analyses are performed for the design and installation of these pipelines and for the selection of associated laying equipment.

Small and medium size Finite Element Models usually present no real problems to the design of offshore platforms. It is only when dealing with large Models that the real difficulties, in using the Finite Element Method, are revealed. In general, these may be split into four categories: solver-related issues; data management issues; "Finite Element" modelling issues; and offshore engineering issues.

It is extremely difficult to select the most suitable "Finite Element" solver for a given problem, particularly when Users and/or Organizations have access to more than one solver. The suitability of a solver for a given problem is a matter of judgment and experience, and is usually related to: it's ease of use, it's cost of use, and on it's modelling and analysis capabilities.

Some solvers are user-friendly and easy to use, others are not. In any case, Users have to be proficient in the use of the solver used in order to avoid costly mistakes and erroneous results. Since it is not practical to expect Users to master the use of several solvers, more often than not, Users find themselves using inadequate solvers simply because they know how to use them. This usually results in Users being forced to make various modelling compromises and assumptions which may very well invalidate the analysis results. A good example here is the Multiple Point Constraints feature of the "NASTRAN" solver program used to mathematically define the dependency of certain degrees of freedom (DOF's) of one or more Nodes on the (DOF's) of other Nodes. Since some solvers do not support this basic modelling requirement, Users have to resort to various simulation techniques (e.g. by connecting these DOF's using dummy "Finite Elements" of infinite stiffness) to get around this problem. These dummy "Finite Elements", however, are very undesirable to have in the Model, particularly if the Model is to be used for Material Take-Off purposes.

Finally, once a solver has been selected, the modelling process and the Model data become totally dependent on that solver. This makes it virtually impossible to switch later to another solver, due to unforseen circumstances, such as system bugs or internal size limitations (e.g. exceeding the maximum number of Nodes or Load Cases). This is a very common problem which faces Users all the time, and the ability to switch over to another solver with minimal effort would be very advantageous.

Data Management Issues are related to the handling, management, and control of large amounts of data. Large Finite Element Models require strict human control and excessive human and computer resources. Mistakes are, therefore, very costly in terms of time and money. The preparation, storage, and control of the massive Model data are always error-prone. It is virtually impossible to maintain data consistency between individuals working on the same Model. It is extremely difficult to obtain accurate estimates of the computer resources required. For example, the CPU time needed to condense a Super Element is, amongst other things, dependent on the bandwidth. Unfortunately, this is not known until the Super Element has been scanned and/or processed by the solver. Inputting and modifying the Model data is usually done on a card-image basis rather than on a logical basis. For example, if a Node is to be deleted, it is usually up to the User to delete any additional data associated with that Node, such as: all the Elements connected to it and all it's applied loads; this process is very tedious and is certainly error-prone.

Finite Element Modelling problems are related to the lack of desirable modelling capabilities. It is virtually impossible to arrive at a near-optimum analytical Model (e.g. the best way to split a Model into Super Elements or the best Element or Node numbering scheme). The amount of work required to make a major modelling change is prohibitive. This discourage the User from making changes which are otherwise desirable. For example, the problem of splitting a Super Element into two or more smaller Super Elements involves tedious Node and Element renumbering operations. It is not always possible to perform various useful operations on the Model before it is ready for processig by a solver. For example, it is crucial that the incidences of certain "Finite Element" types are defined in a specific order (e.g. clockwise or anti-clockwise), otherwise, applied loads may be misinterpreted and may lead to erroneous results.

All the issues discussed so far apply to any large-scale Finite Element problem. Working in an offshore engineering design and construction environment, however, gives rise to even more problems.

The structural Models are usually very large, and hence, all the problems associated with large-scale Finite Element modelling apply. For example, although a global Model of an offshore structure may consist of a moderate number of BEAM Finite Elements, it may have to be analyzed under several hundred loading conditions representing different wave directions and characteristics. Typically the equivalent of some 100,000–200,000 card-images of distributed Finite Element loads could be stored in the database by one Application Program in one run unit (e.g. to conduct a fatigue analysis).

The structural analysis and design cycle requires the use of a large number of programs (e.g. pre-processors, solvers and post-processors), all of which operate on the same basic data. This raises the obvious need for a central file or database.

The structural design data is usually needed by several disciplines, all requiring concurrent access. This raises the need to support a multi-user online environment, with the necessary automatic recovery facilities.

Weather windows in hostile areas, such as the North Sea, usually mean extremely tight schedules. This raises the need for Project Managers to obtain progress reports reflecting the status of the design and analysis at any moment in time.

Structural modelling of offshore structures requires specific modelling capabilities which are unlikely to be supported by any of the general-purpose structural analysis systems (e.g. proper modelling of cutback values, insert piles, grouted piles and ungrouted piles).

It is very seldom that new offshore structures are ever designed from scratch. it is quite customary to use previously designed structures as a starting point. This raises the need to have intelligent access to historical data of previous structures.

It is important to have controlled archiving and restoring facilities in order to archive Models and restore them at a later date (this could be several months or years later, say, in order to do repair work). More important still, is that the archived database should include all information pertinent to the design codes wich were used for the initial design of the structure. For example, if a structure had been designed according to the 9th Edition of the API code, say several years ago, it may not pass today's more stringent 15th Edition code; hence the need to be able to reconstitute the entire design and analysis environment.

From the foregoing, it will be seen that there is a definite need for properly addressing the issues of engineering databases particularly for offshore platform design and appropriate database management systems (DBMSs). This engineering design requires more dynamic and more powerful DBMS's than usual.

SUMMARY OF THE INVENTION

The present invention solves the problems associated with prior art finite element design systems and methods as well as other problems by providing a particular method of modelling an offshore structure using finite element analysis as well as a unique control system which communicates data to and from a unique database using a network-type database management system.

The control system allows data to be communicated between a source of outside data and a unique database under the control of a network-type database management system.

The database of the control system becomes the depository where the model of the offshore structure is designed and checked by one part of the source of outside data, namely the design engineering input. Data on this developing model is concurrently available to other nondesign engineering disciplines such as construction, materials management, etc. Thus various disciplines are provided concurrent access to the same up to date data which is being developed resulting in an efficient and speedy design and construction of any structure such as an offshore oil platform.

The actual method of designing the offshore structure utilizes "finite element" analysis and comprises the following steps. The structure is analyzed in terms of finite elements and nodes which connect these finite elements. This plurality of finite elements and nodes is then condensed into a smaller number of super elements and super nodes by combining certain of the finite elements and nodes. Next, the equilibrium conditions of the super elements and super nodes is determined at interface points such as the water and mud lines to define boundary conditions. The static structure is then analyzed using these boundary conditions to determine the forces and stresses on the structure.

The modelled structure may then be checked against industry standards and codes and then checked against anticipated environmental loading such as waves occurring at the water line of the structure.

It will thus be seen that one aspect of the present inventon is to provide a control system for communicating data between a database having a finite element model and sources of outside data utilizing a database management system. Another aspect of the present invention is to provide a database for modelling an offshore structure using finite element analysis where a single transaction may result in adding/deleting or modifying of over 200,000 finite element load records.

Yet another aspect of the present invention is to provide a method of modelling an offshore structure by combining finite elements and nodes into super elements and super nodes to provide a more manageable structure for design, analysis or construction.

These and other aspects of the present invention will be more fully understood after a review of the following description of the preferred embodiment when considered along with the figures.

IN THE DRAWINGS

Figure 13A:
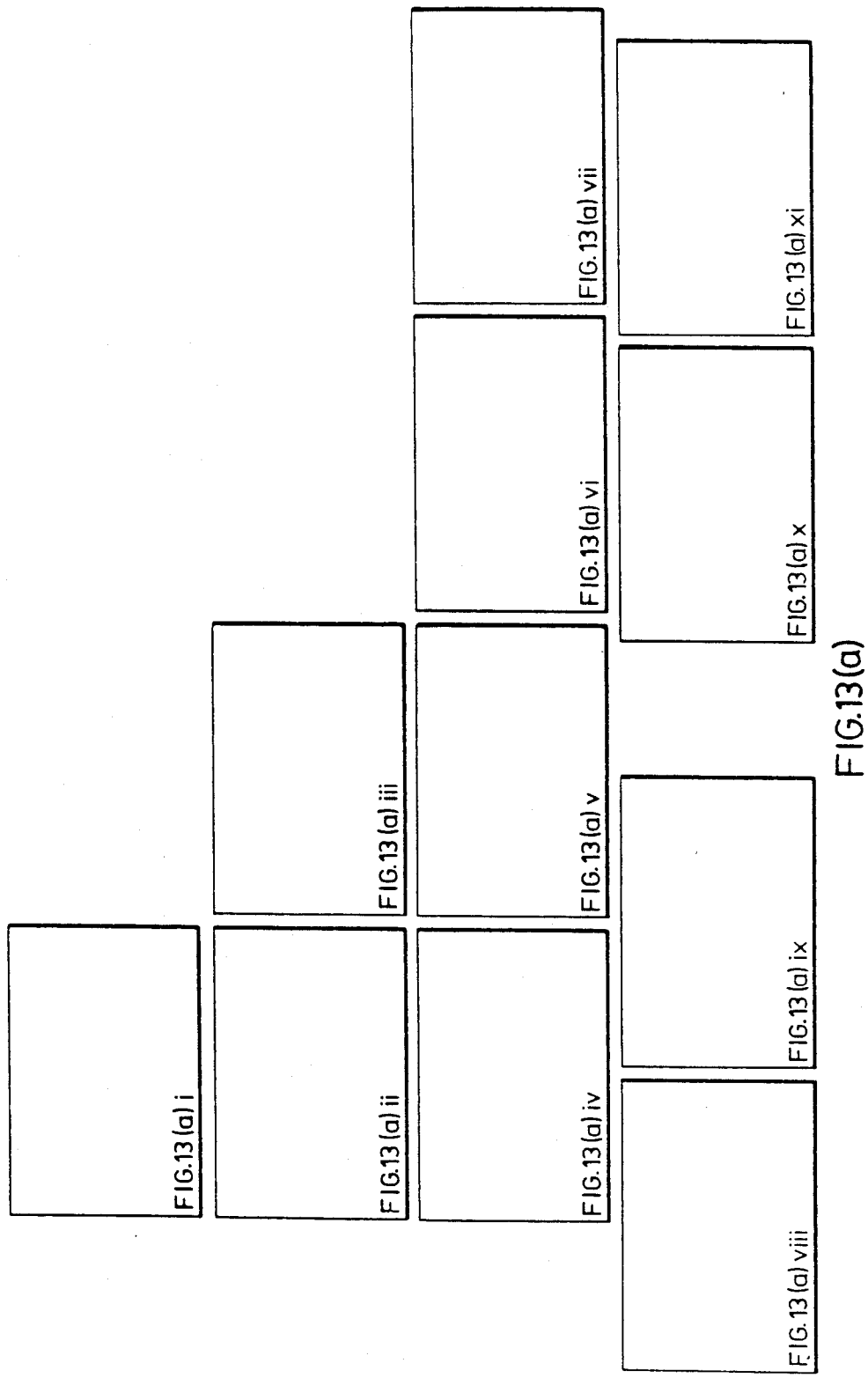

FIGS. 13(a)i to 13(a)xi taken together as shown in FIG. 13(a) depict a schematic representation of one part of the total database of the present invention.

FIGS. 13(b)Ii to 13(b)Ivi taken together as shown in FIGS. 13(b)I and 13(B)IIi to 13(b)IIv taken together as shown in FIG. 13(b)II depict a schematic representation of a second part of the database of FIG. 13(a).

DETAILED DESCRIPTION OF THE PREFERRED EMBODIMENT

Figure 1:
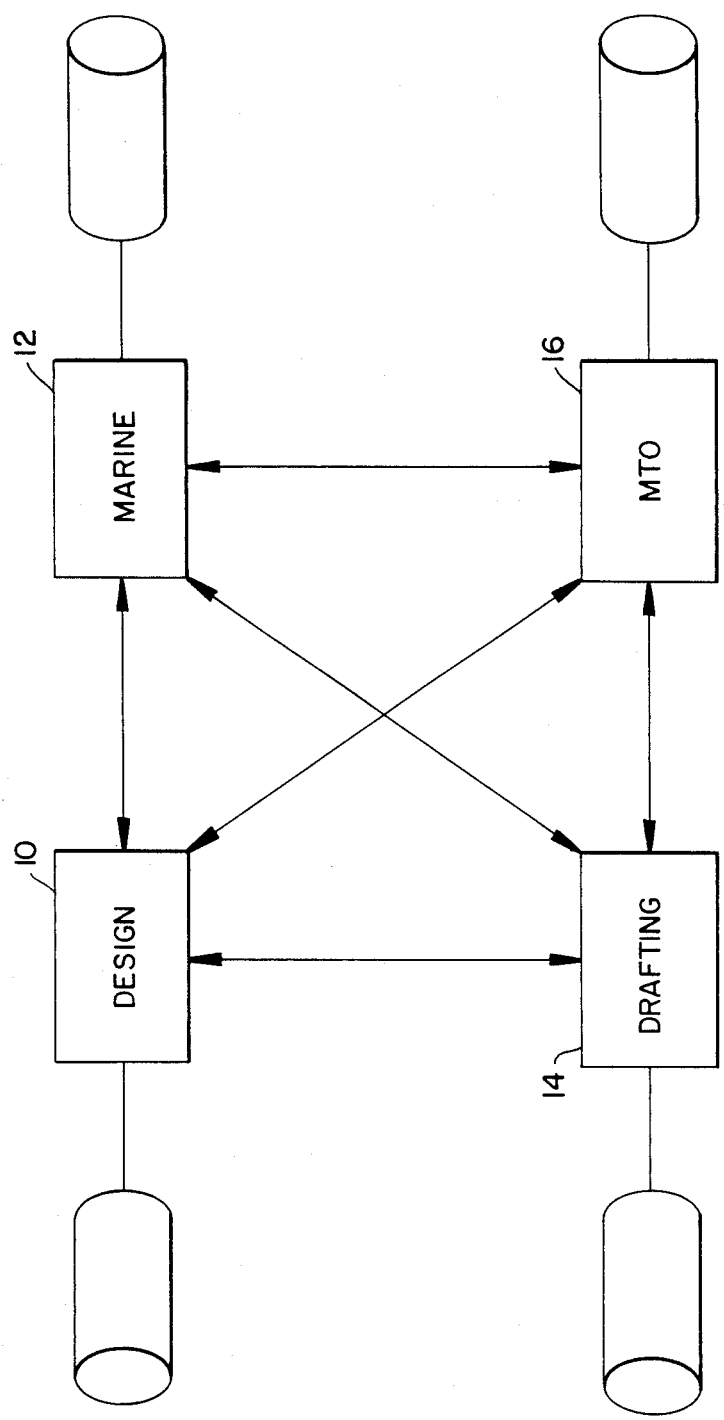
FIG. 1 depicts the relationship between design areas of the present design system.
Figure 2:
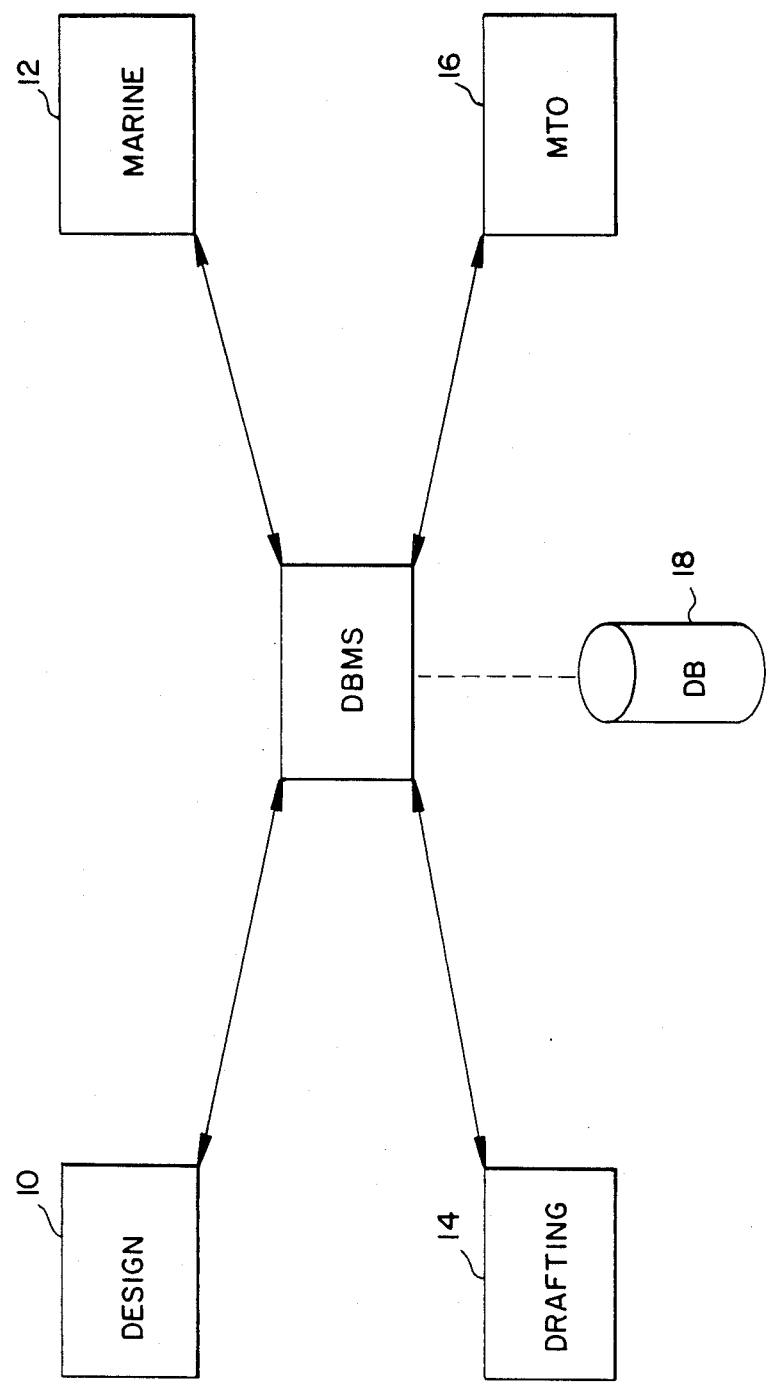
FIG. 2 depicts the database management system with it's inputs as per the design system of the present invention.
Figure 3:
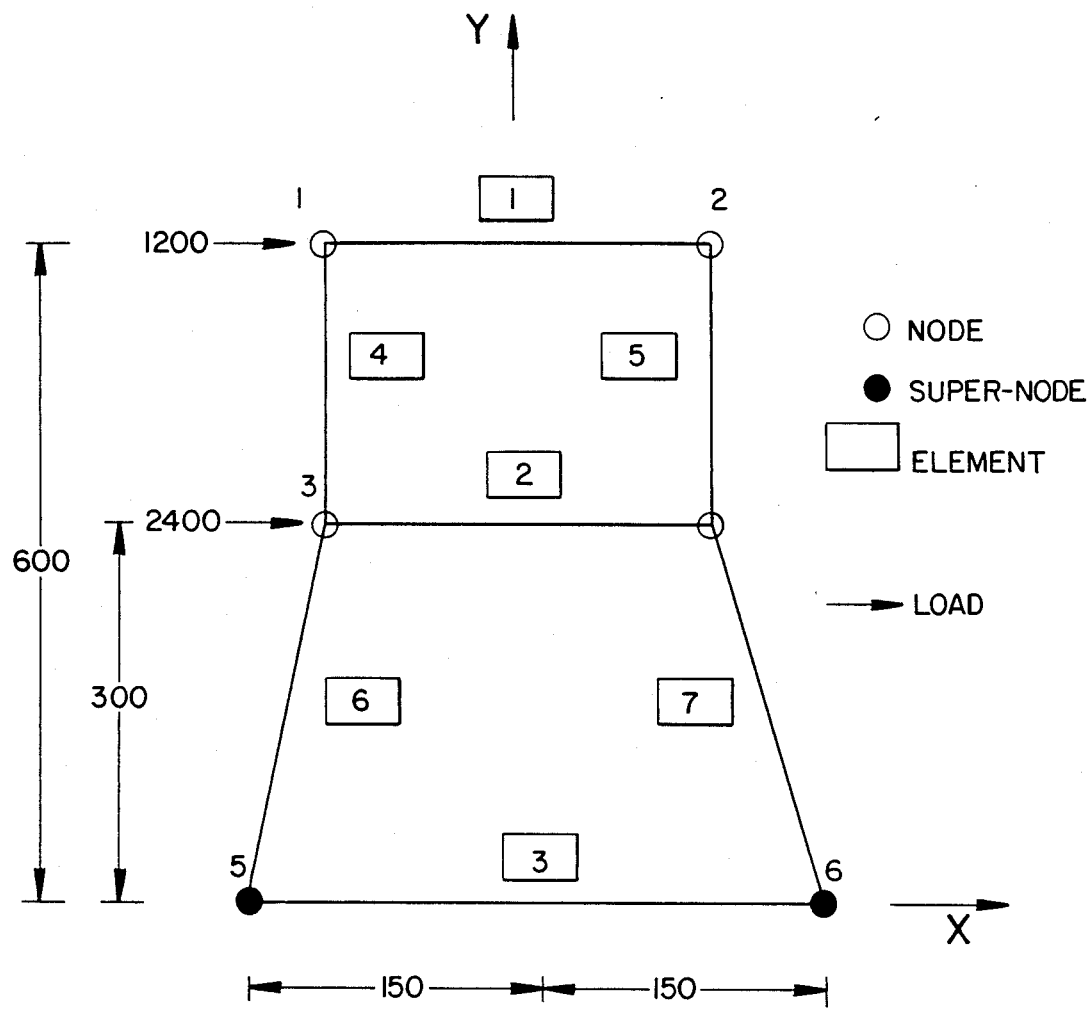
FIG. 3 depicts a sample problem solution using finite element analysis.

Referring now to the drawings in general, and FIG. 3 in particular, it will be seen that in a usual offshore structure engineering environment, it is quite normal for individual engineering disciplines, such as Design 10, Marine 12, Drafing 14, and Material Take-Off 16, to maintain their own versions of the Project they are working on. These different versions may take different forms, such as drawings, reports and computer files. In such an environment, considerable resources are usually expended just to ensure consistency between these different versions, and to keep track of the ongoing changes. This is no longer required using the present automated design system. Here, the Engineering Design group 10 is responsible for modelling the structure under consideration using discrete Finite Elements, down to any desired level of detail. Once this task has been completed, and the Model of the structure has been verified, this one copy of the design becomes the database 18 and becomes instantly available to all other disciplines 10, 12, 14, 16, as shown in FIG. 2. For example, the Material Take-Off group 16 may instantly get the current weight and center of gravity of the entire structure or any part of it; the Drafting group 14 may produce detailed plots of complex joints; and the Project Manager may produce progress reports on the design/analysis phase of the Project from the design group 10.

A typical structural analysis cycle usually consists of three distinct stages: Pre-processing; Analysis; and Post-processing.

Pre-processing starts with modelling the structure in terms of geometry, properties and loads, and ends with defining all the environmental loads such as wave, wind and gravity. The analysis stage starts with a static condensation to reduce the structure into a Super Element with Super Nodes formed from Nodes of the structure. This is then followed by a non-linear interaction analysis to determine the equilibrium conditions at the mudline. This stage ends with a full-scale static analysis on the structure using the boundary conditions obtained from the non-linear interaction analysis; this yields all the internal Node displacements and Element forces and stresses. Finally, the post-processing stage includes applying some of the industry codes (e.g. API, AISC, NPD, etc. . . . ) to check the integrity of the Nodes and Elements. If such checks are passed, the analysis cycle is considered complete; if not, design changes are effected and the whole process is repeated.

The above cycle is now explained in more detail.

Stage 1: Pre-Processing

Modelling: Here, blue prints or sketches are used to idealize the structure in terms of discrete Nodes and Elements by using any of the following methods:

Manual input of nodes and elements into the database 18 by known methods and languages.

Inputting some basic dimensions, of framing panel types from a library of horizontal and vertical panels. Also specification of some basic parameters, such as the number of legs, bays and levels.

Partial or full modelling of the structure from an interactive graphics work station by using known programs such as SUPERTAB.

Once the Model has been generated, by using the above methods, various two- and three-dimensional graphical displays are produced interactively, or in batch, by using any of the following facilities:

One-line plots.

Joint (i.e. Node) detail plots.

General three-dimensional plots using SUPERTAB.

These plots, as well as being of great documentary value, are essential for highlighting any modelling errors. Minor errors are usually rectified using on-line correction techniques, but major errors may require having to start all over again.

At this stage, a typical offshore structure Model may optionally go through a sophisticated eccentricity generator to introduce clearances between each group of tubular members meeting at a given Node. These 3-dimensional clearances may be specified by the design engineer or may default to the values defined in industry codes. Global and local geometrical changes resulting from the introduction of eccentricities can only be appreciated using graphical displays.

Another optional step here would be to split the Model into several Super Elements (unless this had already been done at the Model generation stage). This may be achieved by:

At the end of this modelling stage, the database 18 would contain the following information:

Basic Model identification, Project control information and Users.

Reference data (e.g. RCS, materials and cross-sectional properties).

Node data (e.g. coordinates, RCS, release or support codes).

Finite Element data (e.g. incidences, types, cross-sectional properties and Element materials).

Environmental Loading of the model would then be started. Here, initial wave, wind and gravity loads are applied to the model structure in two steps:

Generation of a wave pressure grid, using any of the theories available, and storing it in a special wave profile file.

Executing a sophisticated wave loading program to generate wave, wind and gravity loads and store them in the database 18, as applied Finite Element and/or Node loads.

An option exists here to go through the motions of load generation without actually storing any loads in the database 18. This is useful in order to select the most critical wave position and direction before attempting to update the database. Wave loads usually consume a significant amount of the database space, the extent of which depends on the number of wave directions, the number of Elements, and on the required combinations, based on maximum and minimum shear force and bending moment at the mudline.

In general, input loads may be defined using any of the following methods:

Wave generators, such as WAVELOAD for BEAM Elements, and MNI WAVE for other Finite Elements (this is the most common method).

Manual input, (for small volumes only).

At the end of this loading stage, the system database 18 would contain the following additional information:

Primary load case entries.
Combination load case entries.
Element loads.
Node loads.

The next step would involve the analysis of the loaded model. This consists of extracting the data from the database 18 by using the appropriate interface for the selected solver or analysis program. Here, the User is not required to know the input data format for such solvers, which is one of the main features of the present design system.

Any Static Condensation techniques used in the Model's data and loads would be extracted by using the appropriate interface for the chosen solver program. The interface creates a formatted file containing the structure as a Super Element with Super Nodes at the piluheads at the mudline. This is then processed by the solver using the static condensation method, in order to reduce the structure into a Reduced Stiffness Matrix (RSM) and a Reduced Force Matrix (RFM). Both the RSM and RFM are then stored into the system database 18 using known interface programs.

Structure Pile Interaction Analysis entails executing a spohisicatd non-linear Structure Pile Interaction Analysis (SPIA) known program. SPIA is an iterative solver used to match the equilibrium mudline deflections for the linear structure with the non-linear foundation Model. These equilibrium displacements are then stored back in the database using other known interface programs.

Static Analysis is accomplished by taking the Super Node displacements produced by SPIA and applying them as boundary Node displacements for the structure, and the entire problem is analyzed again using the preferred solver (this need not be the same as that used for static condensation). Here again, the appropriate interface is used to extract the Model data, loads and applied displacements and feed them into the solver. The final results, which usually consist of Node displacements, Element forces and stresses and support reactions, are stored back into the database 18 using the appropriate interface.

The next stage is the Post-Processing Stage.

At this stage, the Model is ready to be checked against one or more of the industry codes, such as API, AISC, NPD, etc. . . . Here, there are four major design-check criteria:

Member check.
Joint check.
Submergence pressure check.
Fatigue check.

Graphics are used extensively during the post-processing phase. Typically, results (e.g. Node displacements and Element stresses) are extracted using an interface to SUPERTAB, and then displayed in a variety of forms, such as deformed shapes and stress contours.

We will now cover the operational procedures associated with initializing the system database 18 from scratch, initializing a new Model, dumping a Model onto an archive tape and restoring it back to the system database.

Database Initialization

To initialize the database 18 from scratch, the System Database Administrator proceeds as follows:

Initialize and format the physical disk space.

Populate the database 18 with certain Model-independent information, such as: the global Finite Element library, the global database material properties and the global database Units Groups.

At this stage, the database 18 becomes ready to accept the first User Model.

Model Initialization

To initialize a Model, the user simply runs a known program such as MIP (Model Initialization Program), which adds a new Model entry, together with some default information. At the same time, the MASTER User and associated password are defined.

At this stage, the database 18 becomes ready to be populated with the Model data in batch, using known MDLP (Model Definiation Language Processor), or online, using OLU (Online Update) programs.

Model Dump

Once a Model has served it's purpose, and is no longer needed, the user runs a known MDP (Model Dump Program) in order to archive the Model onto tape in MDL format. If this is successfully completed, he then erases the Model using the MIP mentioned earlier.

Model Restore

Should there be a need to restore a Model from an archive tape, the user runs the MDLP program in order to load the Model from it's MDL format onto the system database 18.

Access to System

The system database 18 can be accessed in four different ways: via MDL, for batch update; via CULPRIT, for batch retrieval; via OLU, for online update; and via OLQ for online retrieval. These are explained below.

Model Definition Language (MDL) may be viewed as a flat-file tabular representation of it's corresponding network view within the database 18. It provides total independence of solvers and gives a consistent format for interfacing with external programs. It provides a uniform method for creating a Model, storing it in the database, and extracting it for archiving purposes. It is free-format, driven by headers and keywords, and includes some user-friendly features, such as an auto-increment facility, with zero, positive, or negative increments, to be applied to numeric identifiers.

Example: The following MDL entries assign material properties mat# 3 to all the even-numbered Finite Elements between 200 and 400:

ELEMENT MATERIALS 3 200 TO 400 BY 2

A global ALL facility to apply some value to all entities of a certain kind.

EXAMPLE: The following MDL entries assign material properties mat#3 to all Finite Elements in the Model:

ELEMENT MATERIALS

3 ALL

It provides powerful Model manipulation operations aimed at eliminating most of the tedious manual functions, such as EXAMPLE: The following MDL entries merge three Super Elements (se# 3,4,5) into a new Super Element (se# 6):

SE DEFINITION

6 'SE 6 consists of se# 3,4,5'

SE LEVELS 3 4 5

Online Query (OLQ)

This system includes a comprehensive catalogue of predefined online queries which offers the User instant information on any part of the database. The more experienced User, however, may formulate his own out-hoc queries online. To do so, the User must be very familiar with the structure and content of the system database 18, and must have database navigational experience.

Batch Retrieval (CULPRIT)

Batch retrieval is achieved almost exclusively using CULPRIT, as a report generator, CULPRIT is extremely powerful and has full access to the database 18 Integrated Data Dictionary, IDD, in order to obtain detailed information on the Records, Sets, data items, etc. . . . The major drawback of CULPRIT is that it has to compile the source code at run time, thus adding a certain overhead to each run. Those most frequently-used reports are usually better written in a high-level language, such as PL/1.

Online Update (OLU)

This online mode is menu-driven and gives full-screen access/update capabilities to system database OLU offers the following features:

It provides full-screen editing capabilities to add, delete or modify any data item in the database.

Each primary screen may have one or more secondary screens for extended data entry and additional User information.

It can be used in conjunction with color screens (e.g. IBM 3279), to improve screen readability and User productivity.

Each screen has an associatd HELP screen for online User help facilities.

It offers a STEP mode of operation for beginners and a FAST mode for experienced Users.

The entire OLU system is independent of the Operating System or the TP monitor: these are taken care of by IDMS/UCF.

Finite Element Modelling Features

Next we will describe the various modelling features in the system which allow the User to fully construct a Model, in terms of Finite Elements, Nodes, Super Elements, properties, loads, etc. . . .

Models

The Model is the highest level entry in the system database. A single Model could represent a Finite Element idealization of any structual component, such as a complete offshore structure. Another Model within this same system database 18 could represent a Finite Element idealization of a single tubular junction within the same structure. The maximum number of Models which could be stored in the same system database depends on the total space allocated. The system, as we have seen, has a range of utilities to:

Initialize a new Model.

Dump a Model from the database 18 onto an archive tape in MDL format.

Restore a previously archived Model from tape to the database.

Copy selected data from one Model to another.

Cross-sectional Properties

Cross-sectional properties depend on the Finite Element types used. For example, BEAMs need about a dozen properties, PLATEs usually need one thickness property, TUBEs need a diameter and thickness, while SOLID Elements have no cross-sectional properties at all. The User may define his own cros-sectional properties or may simply refer to standard properties which are stored globally to the system database, such as standard pipes or wide flange profiles.

Reference Coordinate Systems

A Reference Coordinate System (RCS) is an orthogonal set of right-handed axes located at any desired point in space. When a new Model is first created, a global default Reference Coordinate System, located at (0,0,0), is automatically generated (rcs#1): this may be rectangular, cylindrical or spherical.

Additional local Reference Coordinate Systems may be easily created by the User via any three linearly independent points in space, or via a transformation matrix.

Once a Reference Coordinate System has been defined, it may be referred to by any of the following:

Node coordinates.

Node output displacements.

Node releases.

Element releases.

Orientation of Super Elements.
Orientation of Super Element Images.

Nodes

A Node is a theoretical point with fixed coordinates in space. Nodal coordinates and displacements may refer to the same or to different Reference Coordinate Systems. Each Node usually has six Degrees of Freedom (DOF), some of which may be suppressed, or released, relative to any RCS. Node coordinates are stored in the system database in exactly the same way as they are inputted by the User. This means that coordinates with respect to a local RCS are not automatically transformed to the global Reference Coordinate System before they are physically stored in the system database. Thus, it is quite acceptable to have a group of Nodes using a rectangular Reference Coordinate System at the origin, and another group using some other, say, cylindrical Reference Coordinate System located somewhere else in space. It is left to the Application Programs to do any necessary coordinate transformations at run time.

The system allows for a given Node to belong to more than one Super Element, but all Nodes must belong to at least the global Super Element.

Deleting a Node from any Super Element, other than the global one, simply terminates it's participation in that Super Element without physically deleting it from the database 18.

Node Releases/Supports: Node releases and/or supports are defined at the Super Element level in order to allow a given Node to have different release or support conditions in different Super Elements. Releases are defined by simply associating a Node with a predefined reference Release Code, which, in turn, defines which of the six Degrees of Freedom are to be released. Each release Code is usually associated with some Reference Coordinate System, thus making it possible to define local and global Node releases or supports.

K-Nodes: K-Nodes are ordinary Nodes used as reference points to define the orientation of BEAM Elements, and hence, their cross-sectional properties in space.

Inter-Node Relationships: Any Node may be associated with one or more other Nodes via a general purpose Bill of Materials-type of relationship, such as that needed to define Multi-Point Constraints (MPC) in the known NASTRAN program.

Finite Elements

The Finite Element (FE) is the smallest building block in the structural Model. Each Finite Element must have a unique identification number within the Model, and must be of one of the types which are defined global to the system database in the so-called Finite Element library. The system has no built-in limit on the number of Nodes per Element.

Finite Elements may be grouped to form Super Elements. The system allows a given Finite Element to belong to more than one Super Element, but all Elements must belong to at least the global Super Element.

Finite Element Types: Finite Elements vary in their name, type, number of Nodes, cross-sectional properties, load carrying capability, and in their output results. A global Finite Element library is maintained in the database 18 and may thus be referenced by any Model. This library contains the common types, such as BEAMS, TUBES, PLATES, SHELLS and SOLIDS, which are supported by most solvers (other types, such as heat transfer, may be added to the library using OLU). Furthermore, it is quite possible to add special purpose Psuedo-Elements, such as whole conical shells, ring stiffeners, buoyancy tanks, etc., to be used for drafting, marine or Material Take-Off applications.

The design system supports non-uniform concentric BEAM elements using the concept of segments and sections. A Finite Element may consist of one or more segments, and a segment may contain one or more sections. Both segments and sections may be associated with different material and cross-sectional properties.

Finite Element Properties: Each Finite Element must be associated with a set of material and cross-sectional properties. These properties, together with the geometrical shape defined by the Node coordinates, fully define the Element Stiffness Matrix (ESM), which may be optionally stored in the database 18. Cross-sectional properties vary from one type of Element to another (e.g. PLATES may have a single thickness property, whereas BEAMS may need a dozen properties to define moments of inertia, area, etc.).

Finite Element Releases: Finite Element Releases (restricted to BEAM Elements only) are defind at the Super Element level in order to allow a given Finite Element to have different release conditions in different Super Elements. Releases are defined by simply selecting one of the reference Release Codes, which in turn defines which of the six Degrees of Freedom are to be released. Each Release Code is usually associated with some Reference Coordinate System, thus making it possible to define local and global BEAM releases.

Super Elements

The concept of Super Elements (SE) plays a major role in the design system. In it's simplest form, a Super Element (or sub-structure, as it is sometimes referred to) is a collection of Finite Elements. Super Elements are used to split a large Finite Element Model into smaller, more manageable units and perhaps, more importantly, into units such as Support Frame, Bottle Legs, Jacket, or piles, which correspond to the way in which the design, analysis or fabrication of an offshore structure would be carried out in a real life situation.

Another useful application for Super Elements is to allow different idealizations of a given structual component. For example, in a crude analysis of an offshore structure, a Bottle Leg may be idealized as a Super Element consisting of a single BEAM with some equivalent cross-sectional and material properties. Subsequently, in a more accurate analysis of the same Model, another Super Element containing hundreds of Finite Elements may be used instead.

The present design system requires that each Node must have at least one global Super Element, which is automatically stored in the system database when a new Model is first initialized. This global Super Element may be used in problems which do not necessarily require the use of Super Elements in their proper sense.

A Super Element may be viewed as a generalized Finite Element with a variable number of Nodes called Super Nodes. It may consist of any combination of Finite Elements and/or Super Elements. This means that Super Elements may be nested down to any level.

Another useful way of defining a Super Element is by specifying the region it occupies in space. For example, a Super Element for the Support Frame could be easily created by stating that it includes everything above elevation 110 meters.

In general, sensible use of Super Elements reduces the cost of data preparation, validation and analysis, and offers greater scope for making local design changes to one or more Super Elements without impacting the rest of the Model.

Super Element Types: There are two types of Super Elements stored in the database 18: internal and external. An internal Super Element has all the data of its constituents (i.e. Nodes, Elements and properties) explicitly stored in the database 18. An external Super Element, on the other hand, only has its Super Nodes and Reduced Stiffness Matrix (RSM) stored in the database 18. Such a matrix could have been manually calculated, or more usually, would have been produced by using static or kinematic condensation techniques, which are available in most solvers.

Super Element Properties: These consist of three reduced matrices: the Reduced Stiffness Matrix (RSM), the Reduced Mass Matrix (RMM), and the Reduced Damping Matrix (RDM). Although these matrices are normally generated by Application Programs or solvers, it is also possible to manually define them using MDL. Another useful Super Element property is it's connectivity matrix, which has many uses, particularly in the areas of topological validation and bandwidth optimization.

Super Element Super Nodes: Each Super Element must have a set of Super Nodes (SN) which may be thought of as incidences of the Super Element. Super Nodes have all the attributes of normal Nodes, such as coordinates, Reference Coordinate Systems, supports and Release Codes.

Super Element Images: One of the most powerful Finite Element modelling techniques is that of Super Element Images used to define repetitive structures. For example, in a four-legged structure, only one of the four bottle legs needs to be fully defined in terms of Finite Elements, Nodes, properties, etc.; the other three could be simply defined as being identical or mirror images of the first.

Applied Loadings

Before a Model can be analyzed, all external environmental effects acting on the structure must be defined as a series of Load Cases (LC), which may include any combination of applied Node or Element loads and imposed Node displacements.

Each Load Case is given a unique numeric identifier, together with some descriptive text. There is no built-in limit on the maximum number of Load Cases allowed. Load Cases are defined at the Model level for each Super Element.

There is provision in the database 18 to store wave profiles in which a given wave is represented by a pressure grid for one full wave, and which vary from one location to another (e.g. Gulf of Mexico vs. North Sea). This library of wave profiles may be referenced at run time by the wave load generation program for a given model.

Primary Load Cases: These are sometimes called independent Load Cases. Here, all the load components (Node and Element loads) are explicitly defined and stored in the database 18. Node loads consist of concentrated forces and moments, imposed displacements and rotations; Finite Element loads include concentrated forces and moments, distributed edge forces or moments, surface pressures, temperatures, strain, as well as body-type loads such as gravity and inertia.

Combination Loading Cases: These are sometimes called dependent Load Cases since they are defined as linear combinations of previously defined Load Cases. Nested combinations (i.e. Combination Load Cases that are made up of other Combination Load Cases) are allowed, and there is no built-in limit on the level of nesting. The system only stores the relations defining Combination Load Cases and does not resolve the loads into their equivalent primary Load Cases (this is left to the individual Application Programs).

Global Super Element Loads: Global Super Element Loads are simply a convenient way for defining a global load value for a given Super Element without having to explicitly define it (and physically store it) for each individual Finite Element. For example, this could be effectively used to specify, for a Super Element, an overall gravity load in the negative y-direction or a uniform pressure load.

Foundation Modelling Features

These include features for soil modelling, pile modelling, and soil/pile group modelling.

Soil Properties

The database 18 contains sufficient data structures needed to fully define linear and non-linear soil properties for a given Model. These consist of the following:

P-Y Curves: Each curve applies to a given depth below the mudline and consists of a series of pairs of values for lateral load (P) and lateral deflection (Y).

T-Z Curves: Each curve applies to a given depth below the mudline and consists of a series of pairs of values for torsional load (T) and rotation (Z).

Skin Friction Table: This gives the distribution of skin friction along the depth of the pile.

Shear Strength Table: This is a single table defining the soil shear strength values at different depths.

Piles

A pile is a segmented tube comprising a variable number of segments with varying segment lengths, cross-sectional properties, and materials properties. Furthermore, a pile may consist of one or more concentric piles, e.g. one primary pile enclosing one or more insert piles.

There are two methods for modelling piles in the system database 18:

Method 1: In this method, each segment is defined as a proper 2-noded BEAM element. Typically, this could result in about 50 Nodes and Finite Elements, which may then be grouped as a single Super Element. Also, the physical making of the pile may be properly defined using the inter-FE relationships mentioned later (e.g. physical Elements and enclosed Elements).

Method 2: In this method, the entire pile is defined as a single Element. Here, the entire combination of primary pile and insert piles, if any, would be defined as a single 2-noded segmented BEAM Element, consisting of several segments and sections, each with it's own cross-sectional and material properties.

Whether Method 1 or 2 is used, the entire pile configuration must be defined as a single Super Element with one of it's Super Nodes at the pilehead.

In most structures, individual piles are identical in their physical making, but have different orientation in space in relation to the structure. In such cases, only one parent pile Super Element need be defined at some convenient orientation and location (e.g. vertical at (0,0,0)), and all the other piles would be defined as Super Element Images. This is a very useful feature since it is not uncommon to have offshore structures with 32 or 48 piles, for which only a single pile information is stored.

Soil/Pile Groups

A Soil/Pile Group is simply a convenient facility for associating a pilehead Node with a given set of soil properties. Once the jacket Super Element is defined, it is connected to the piles at the corresponding pilehead Nodes. As mentioned earlier, the pilehead Node should coincide with the pile Super Element Supe Node at the mudline. The soil properties may consist of an combination of P-Y curves, T-Z curves, and shear strength values. The association between each pile Super Element and it's corresponding soil properties is needed to perform the non-linear structure/pile interaction analysis, as well as to complete the pile analysis and design. Since soil properties are Model-dependent, it is possible to use the same soil values in different Soil/Pile Groups.

Next, we will describe some of the physical, as opposed to analytical, modelling capabilities, which have been specifically incorporated in order to effectively meet the requirements of offshore structures.

Finite Element Eccentricities

Finite Element eccentricities (restricted to BEAM Elements) may be definEd at each end of a BEAM Element. This facility is used to improve the modelling of tubular connections by including minimum gap clearances between braces at connections. This produces more accurate data for the purpose of wave loads, gravity loads, buoyancy, installation forces, preliminary Material Take-Off, and graphical displays of the structure. The actual information stored in the system database 18 to support this facility consists of: 1-Original center-line to center-line geometrical information.

2-Modified geometry as a result of introducing minimum clearances.

3-Information needed to model the shortening of the tubular BEAM Elements, due to their intersection with chord Elements of finite size.

Inter-Finite Element Relationships

Any Finite Element may be associated with one or more other Finite Elements via a general purpose Bill of Materials-type of relationship. This is effectively utilized to simulate the following requirements:

Collinear Elements: these are a geometrical/design requirement, namely, that two or more Elements should remain on a straight line, irrespective of any geometrical changes to their surrounding Nodes or Elements.

Physical Elements: these result from a fabrication requirement, namely, the identification of all the collinear Finite Elements which make up a single physical component, such as a jacket leg.

Enclosed Elements: the concept of enclosed Elements is essentially an analysis requirement, wherein one or more tubular Elements are enclosed within other tubular Elements; for example, a pile enclosed within a jacket leg.

Psuedo-Elements

Although Finite Element types are building blocks with specific force-displacement relationships, the design system allows the definition and use of Psuedo-Elements which may be used for a variety of non-structural applications. For example, a CONE Element may be defined to give an accurate graphical representation of a conical shell with known dimensions. The type of this Element would be CONE. It would have two Nodes at it's two center points, and it's cross-sectional properties would consist of the top and bottom diameters and the height. Thus, such a Pseudo-Element could be used to accurately calculate the weight, volume, and center of gravity of a conical shell, instead of obtaining them from it's corresponding Finite Element idealization.

Similarly, one could think of a Psuedo-Element called RING for a ring stiffener, TANK for a buoyancy tank, and FILLER for water, grout or air between two tubular Elements.

Next, we will describe some of the miscellaneous features of the design system, which are fully integrated with the modelling features. These include: Units Groups; Comments; Group Types; and History log.

Internal Units within the design system may vary from one Model to another and need not be consistent within a given Model. A set of predefined Units Groups are available on a global basis. Each Units Group defines the exact Units used for certain database entities, such as coordinates, cross-sectional properties, material properties, etc. For example, the system allows the cross-sectional diameter and cross-sectional thickness to be in different units (e.g. imperial diameter and metric thickness).

When the user initializes a new Model, he must select some convenient Units Group from the global set. If none of the available Units Groups are appropriate, the user may define a new Units Group, which then becomes available to all other Models and Users.

Group Types

It is sometimes required to group certain database entities into one or more identifiable groups for subsequent reference. For example, the User may be interested in grouping all Nodes which are above the elevation of 110 meters, or all Finite Elements in the x-y plane. Another example is the 'weight per joint' report required by the Material Take-Off group 16, which requires grouping all the Elements associated with a given Node. The system allows such arbitrary groupings using the Group Type facility. Each Group Type is assigned a unique 8-character identifier, and may consist of an arbitrary list of Nodes, Finite Elements, Super Elements, Load Cases, or even other Group Types. This means that Group Types may be nested down to any level.

The Group Type relationship is many to many; meaning that, for example, a Group Type may consist of any number of Nodes, and that a given Node may participate in many Group Types.

Although most Group Types would be user-defined, some Application Programs would generate their own Group Types needed by other parts of the system. For example, some of the Application Programs would automatically generate hundreds of Group Types which are needed to identify specific frames, bays or trusses within an offshore structure.

Comments

This system allows the User to define any number of comments for any of the main entities, such as: Model; User; Group Type; Node; Finite Element; Super Element; Soil/Pile Group; and Load Case.

Each comment consists of a text portion of up to 64 characters long, the date and time stamps, together with the Model, User, and Super Element identifiers (m#, u#, se#).

Database History

A special Area is reserved in the system database 18 for storing historical data on all active Models. This consists of certain identification data, date and time stamps, together with any useful comments. Once the database 18 history Area becomes near full, the System Database Administrator runs HDP (History Dump Program) to dump this Area onto an archive tape and release the disk space. He then reinitializes the aforesaid Area before it can be used again. Also available is a series of CULPRIT programs to produce history reports, sorted by Model, User I.D., date and time. These reports show all the transactions that have taken place for each Model in the system database 18 and are of great value to Project Managers.

Database Security Features

There are four levels of security in the database 18.

Operating System Level: This level refers to the User I.D., password, accounting information, etc. needed to sign-on to the Operating System's TP monitor. This is usually the responsibility of the Systems group. Auditing requirements require that passwords are changed at random intervals.

Dataset Level: This level refers to the security offered by special software packages such as ACF2. Here, the system prevents unauthorized access to datasets (files), whether such files are data files or program files. For example, this level could be used to prevent anyone but the System Database Administrator from running the DIP, or anyone but the Engineering Database Administrator from running the MIP.

DBMS Level: Here, each authorized User must be registered by the System Database Administrator in the Integrated Data Dictionary.

Application System Level: This level is controlled by the system Application Programs according to the control information stored in the database 18 itself.

When the Enginering Database Administrator first initializes a new Model, a special User entry, with a special MASTER password, is stored giving the Project Manager unrestricted access to the system database 18 (only one unrestricted User is allowed per Model). Later, this MASTER User may add any number of Users, specifying for each of them whether or not they are allowed to store, modify, or delete Super Elements or Group Types. Thereon security is on a Super Element basis. All Application Programs call a special authorization routine which checks the User I.D., password, Model, and Super Element. This routine would abort immediately in the event of an unauthorized User attempting to gain access to the Model.

Illustrative Problem

In this Section, a simple example to illustrate the use of the Model Definition Language (MDL), for defining a Finite Element structural Model, is presented. In general, the data required to fully describe any Finite Element Model consists of three parts:

1. Topology: This describes the connectivity of the Model, which consists of a list of Element identifiers, Element types, and Node identifiers.

2. Properties: These assign numeric values to each Nodal and Elemental property, such as Element cross-sectional properties and material properties.

3. Loads: These define the external loads acting on the Model, such as Node forces, Element pressures and temperatures.

Problem Definition

The problem represents a hypothetical offshore structure, modelled as a two-dimensional frame in the X-Y plane (FIG. 3). It consists of 7 Finite Elements (fe# 1 to 7) and six Nodes (n# 1 to 6).

The entire Model is to be viewed as a single Super Element (se# 2) whose Super Nodes are the two mudline Nodes (n#5 and 6).

There are no support Nodes for this problem, since it is assumed that all that is required is a static condensation on the entire Super Element.

All Finite Elements have the same material properties (mat# 1).

Two unique sets of cross-sectional properties are used: xsec# 1 has a diameter and thickness of 16.0 and 0.5, respectively. The corresponding values for xsec# 2 are 30.0 and 1.0.

Only one Load Case is to be considered. This consists of two simple concentrated loads applied at nodes n# 1 and 3.

In what follows is a section of the MDL input needed to define the problem. MDL-type comments are used to improve readability, and to provide the reader with additional explanatory remarks.

---

INITIALIZATION
Initialize a new Model.
MODEL INITIALIZATION
PROJECT 'sample'   MANAGER 'Shebini'   PLANE 'xy'
                TOPOLOGY
Define the x,y,z coordinates for each Node
            NODE COORDINATES
    1 X     −150        Y       600
    2 X      150        Y       600
    3 X     −150        Y       300
    4 X      150        Y       300
    5 X     −175        Y         0
    6 X      175        Y         0
Define the connectivity of the Model
        ELEMENT INCIDENCES TYPE TUBE
        1           1           2
        2           3           4
        3           5           6
        4           3           1
        5           4           2
        6           5           3
        7           6           4
Define Super Element (se#2) consisting of everything above Y=0
    SE DEFINITION
    2 TEXT 'All Elements and Nodes above Y=0.'
    SE REGION
    Y1 0.0
Specify the Super Nodes of the Super Element
            SE              SN
             5               6
                PROPERTIES
Define the reference materials to be referred to later
            MATERIAL PROPERTIES
                1 E 29000.0 NU 0.25
Select a previously-defined set of material properties for each FE
    ELEMENT MATERIALS
    1 ALL
Define the reference cross-sectional properties to be referred to later
            SECTION PROPERTIES
    1       D1      16.0        T1      0.5
    2       D1      30.0        T1      1.0
Select a previously-defined set of cross-sectional properties for each FE
        ELEMENT PROPERTIES
    1           1       TO           3
    2           4       TO           7
                LOADS
Define the Loading Case lc#1
    LOADING    1 'Load Case 1: Hoizontal Loads at Nodes 1,3'
Define the applied loads for the required Loading Case
            NODE LOADS
    1       FORCE       X       1200
    3       FORCE       X       2400
                FINISH
End of MDL input data
    FINISH
End

---

Typical User Operations

Once a Model has been successfully processed by the Model Definition Language Processor (MDLP), and stored in the database 18, the User would normally validate it using a variety of tools at his disposal. One such tool is OLQ, used to execute any of the extensive library of catalogued queries (QFILES). For example, in order to check that there are only two Super Nodes (sn#5 and 6) for se#2, the User would invoke a defined query Q335, which lists all the Super Nodes for a given Super Element for a given Model. This is accomplished by signing on to IDMS, then signing on to OLQ, and then entering:

| Q335 | sample 2 |
|---|---|
| or | |
| ALL-SUPER-NODE-FOR-SE# | sample 2 |
| where | |
| Q335 | is the short-code query identifier |
| ALL-SUPER-.. | is the long descriptive query identifier |
| sample | is the Model identifier |
| 2 | is the Super Element identifier |

In response to the above query, OLQ would display the following information, thus confirming that the Model has been correctly defined:

| ALL SUPER NODES FOR SE# 2 |
|---|
| 5 |
| 6 |

OLQ is just one of many tools for the validation and manipulation of structural Models. The following is a representative list of some of the more valuable operations and queries which can be used by any system User in order to ascertain the correctness of a given Model before proceeding with a costly analysis, thus improving his productivity and saving time and money. The system is a live and intelligent database:

List all Nodes, internal Nodes, support Nodes, Super Nodes, etc.

List all Elements.

List all cross-sectional properties.

List all material properties.

List all Super Elements.

List all Elements connected to a given Node.

List all floating Node (i.e. those not connected to Finite Elements).

List all Elements having a given set of cross-sectional properties (e.g. all TUBE Elements having an outer diameter of 24 inches, or all 2-inch thick PLATE Elements).

List all Nodes between two elevations (e.g. all Nodes at the mudline).

List all Super Elements within a given Super Element.

Merge two or more Super Elements into one.

Split a Super Element into two or more Super Elements.

Check that all PLATE Elements are numbered counter-clockwise.

Check if two or more Elements have the same incidences.

Copy selected date from one Model to another.

Calculate weight and center of gravity.

Calculate principal moments of inertia and orientation of principal axes.

Calclate length, surface area or volume of specific Element types.

Calculate welding volume for each Node.

Calculate direction cosines for a given BEAM Element (e.g. check if a given Element is truly vertical).

Calculate the maximum bandwidth, average bandwidth and standard deviation.

Calculate the computer resources needed to perform a complete analysis.

List all the changes made to a given Model or Super Element.

When was a given Super Element last modified? Who modified it? What was the nature of the modification?

Count the number of Nodes, Finite Elements. Super Elements, etc.

Are there any properties which are not referenced by any Element?

Has a certain User completed his assigned task?

Has a given Super Element been condensed? Has it been analyzed?

Is there a Units Group already defined which allows diameters to be in inches, and thickness to be in mm?

Are there any Models in the database for 8-pile structures in over 800 ft. of water?

DATABASE DESIGN

There are many criteria by which the system may qualify for being a database system. For example, the following definition of a database may be used:

" . . . a generalized, common, integrated collection of company or installation-owned data, which fulfills the data requirements of all applications which access it, and which is structured to model the natural data relationships which exist in a company."

The system certainly satisfies the above definition, and possibly any of the other definitions that may have emerged over the years. Following this introduction, we briefly explain the approach taken in designing the database, and the constraints which were taken into consideration.

Database Design Approach

At this stage, we note the practical constraints under which the system database 18 has to be designed and implemented. For example, it is important to recognize that the system database is managed by IDMS, which is a CODASYL-type (i.e. network-type) DBMS (database management system, which obviously favors the use of a network data model as a starting point. In prctice, the system datbse design process followed a combined network/relational approach, sometimes starting with a relational view and mapping it onto a network view, and sometimes the other way around. The fact that the network model, and the relational model, are inherently related; and tht it can be shown that a unique mapping from one onto the other without loss of data always exists, renders the distinction between the two data models, at least for our design purposes, of little significance. It is also worth mentioning that the approach adopted here is a practical one in which intuition and known constraints have played a major role. For example, although most Schema Records in the system are, indeed, in Third Normal Form, there are certain cases where practical considerations prevailed, thereby resulting in some Schema Records having repeating groups, thus disqualifying them from being even in First Normal Form. However, there has recently been a trend to extend the relational model so that it can cope with repeating groups. This may, in the future, obviate the need for a relation scheme to be in First Normal Form.

The main considerations that had to be taken into account when designing the system database 18, covered the basic Schema components, such as Areas, Records, Sets, etc.

Areas

Area Allocation: Although this is mainly done on logical and natural grounds, it also involves considerations of run time performance. This is so because increasing the total number of Area defined in the global DMCL is known to have an adverse effect on IDMS performance.

In the database 18, there are two types of Areas:

Model-Independent Areas: These contain Schema Records which are not linked to other Schema Records in other Areas in any way, and hence, may be archived or restored independently of the rest of the database 18 (e.g. global material properties and global cross-sectional properties).

Model-dependent Areas: These contain Schema Records which are associated with other Schema Records in other Areas, via Schema Set pointers.

Area Names: Wherever possible, meaningful Area names are used, prefixed by SDB (Structural Database) for ease of identification within the global DMCL, and to conform to the user's standards.

Records

Record Names: Meaningful Schema Record names are used wherever possible. This is particularly useful when using the online query facility OLQ.

Record Length Mode: Most of the Schema Records are of fixed length. Only seven are of variable length, and this is due, mainly, to the presence of repeating groups (OCCURS . . . DEPENDING ON . . . clause). Although the corresponding relations of such Schema Records would not be in First Normal Form, the decision to retain repeating groups is essentially a matter of judgment and efficiency.

Sets

Set Linkage Options: Since NEXT pointers are mandatory in IDMS, the choice is whether or not to include PRIOR and/or OWNER pointers as well. In addition to being able to traverse Schema Set occurrences in the reverse direction, PRIOR pointers allow IDMS to perform the ERASE DML command quickly and efficiently. The penalty for each additional PRIOR pointer is 4 bytes of storage space per Schema Record occurrence, which, after careful consideration, is comparatively negligible. Accordingly, all Schema Sets have PRIOR pointers.

OWNER pointers, on the other hand, have been included in 69 out of the 122 Schema Sets, where it was felt they were needed in order to speed up certain queries or transactions. As a general rule, however, all Schema Sets used in association with LINK Records for m:n and Bill of Materials relationships have OWNER pointers.

Set Membership Options: Most Schema Sets (98 out of 122) are MANDATORY AUTOMATIC, implying the existence of certain constraints to be automatically applied by IDMS. For example, data describing a Finite Element Model must be stored into the database 18 in a specific order (e.g. Reference Coordinate Systems must be defined before Nodes, and Nodes must be defined before Finite Elements). The MANDATORY AUTOMATIC option may thus be used to guarantee such dependency without having to rely on the Application Programs.

The Schema Set statistics given earlier show that there are only six MANDATORY MANUAL Schema Sets. These correspond to half of the 12 Bill of Materials relationships which always come in pairs of MANDATORY AUTOMATIC and MANDATORY MANUAL.

Finally, OPTIONAL MANUAL is used in cases where a member occurrence is allowed to change it's owner. For example, changing the material properties of a Finite Element after it has been stored.

Set Order: Most Schema Sets are ordered NEXT. Although this gives Application Programs more freedom for establishing currencies anywhere along a given Set occurrence, this is not of any particular significance to the system Application Programs.

SORTED Sets, however, are extensively used and play a major role in accessing a Schema Record occurrence based on it's key value. They are also extremely useful in guaranteeing uniqueness of keys, using the DUPLICATES NOT ALLOWED option in the Schema DDL. For example, in order to prevent a Super Element containing the same Finite Element more than once, the LINK Record employed to model the m:n relationship between Super Element and Finite Element contains the Finite Element key identifier (fe#) on which the Schema Set, from Super Element to Finite Element, is sorted with DUPLICATES NOT ALLOWED.

Data Items

Data Item Types: Since the system is an Engineering database, it is no surprise that certain data types, which are normally used in commercial systems, are absent (e.g. fixed point decimal data items). In fact, the majority of data items are floating point numbers which are needed to store extremely large and extremely small numbers within the same number of bytes. All floating point numbers used in the system database 18 are in single precision, the exception being the SE stiffness, mass and force matrices, which are stored in double precision.

Full-word integers are used extensively as key identifiers. One of the main reasons behind choosing IDMS is the fact that it's Schema structure supported all the basic data types, such as: integers, fixed decimals, bits, floating point numbers, strings, and single/double precision.

Pianned Redundancy

As with any practical database design, that of the system database 18 involves a certain amount of redundancy. This manifests itself in two different ways:

By storing key identifiers in the LINK Record of an m:n relationship, so as to avoid having to access it's owner.

By defining additional Schema Records and Schema Sets only to provide alternative, faster access paths to information which may be fully obtained by other, though much longer, paths.

Figure 4:
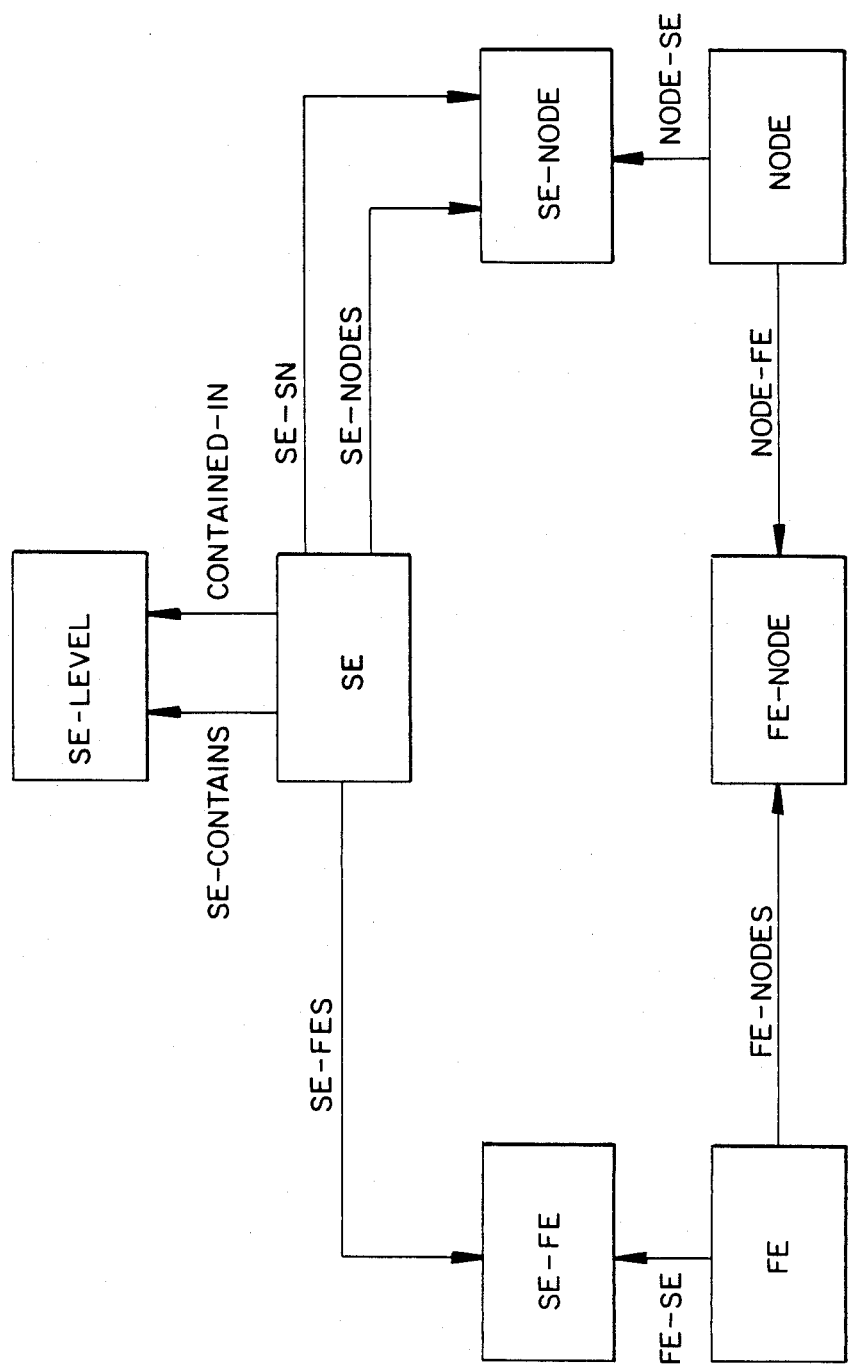
FIG. 4 depicts typical finite element and node relations of the present design system.
Figure 5:
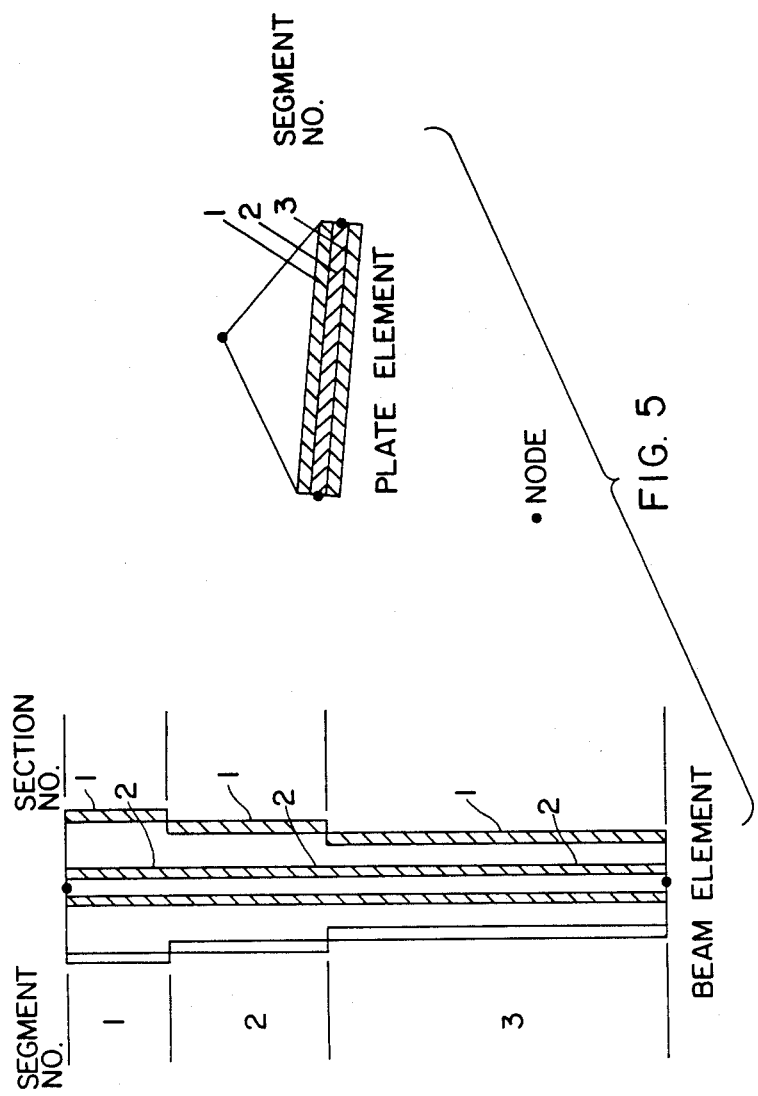
FIG. 5 depicts segments and sections connecting nodes of the present design system of the present invention.
Figure 6:
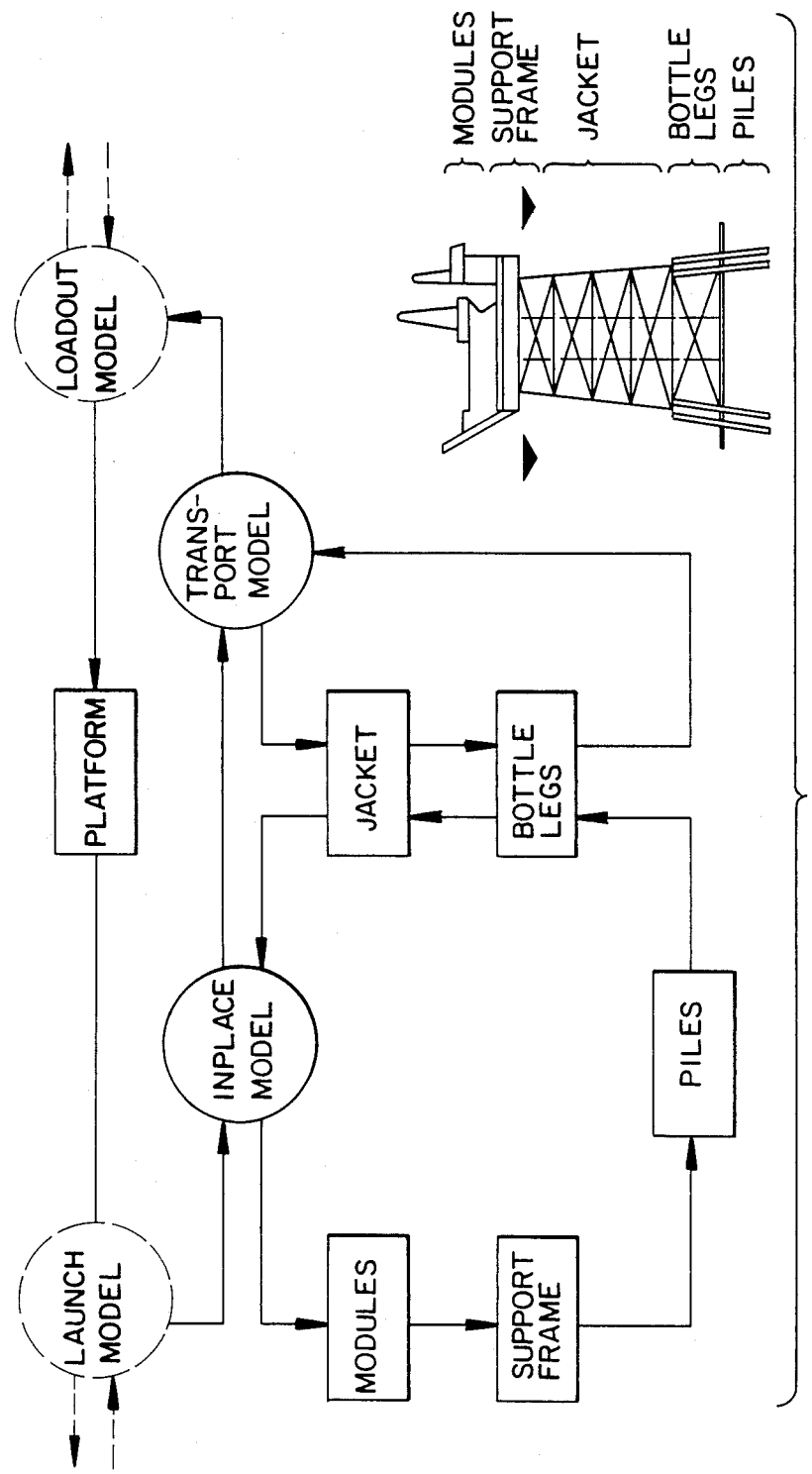
FIG. 6 depicts a schematic of the design system used for structural analysis of an offshore platform.
Figure 7:
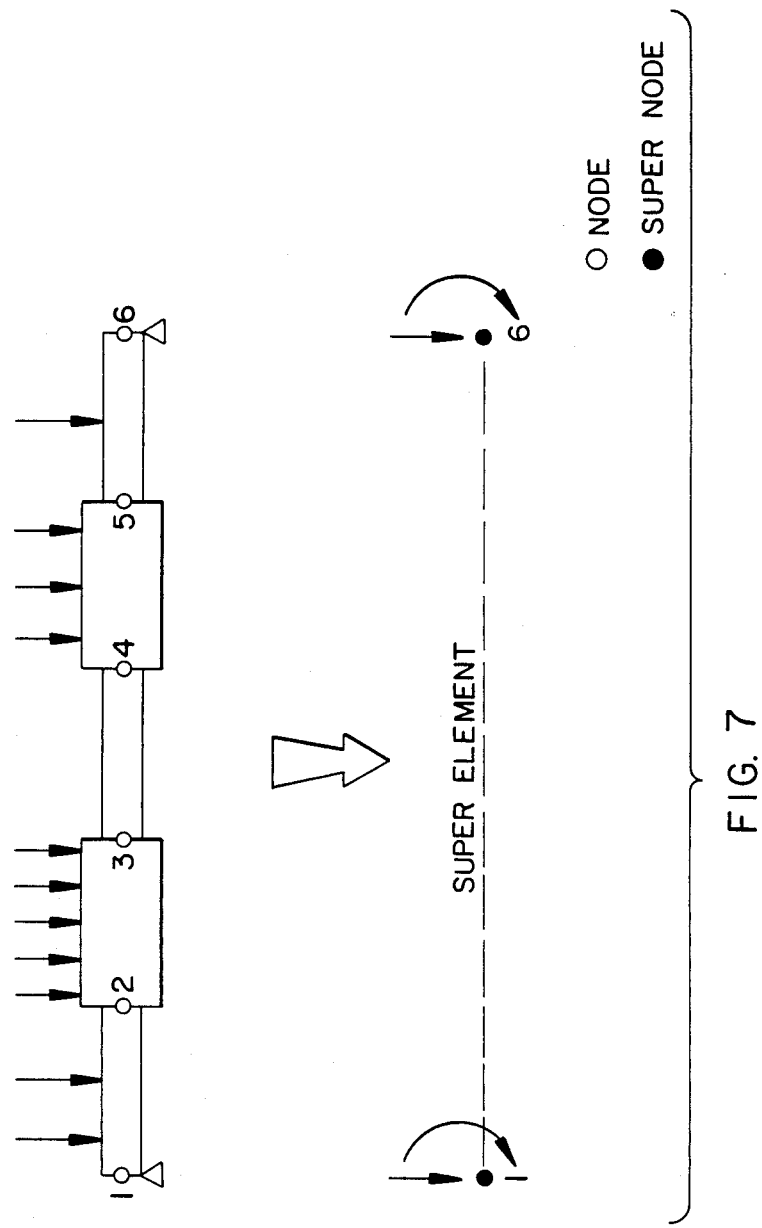
FIG. 7 depicts static condensation of nodes to super nodes in the design system of the present invention.
Figure 8:
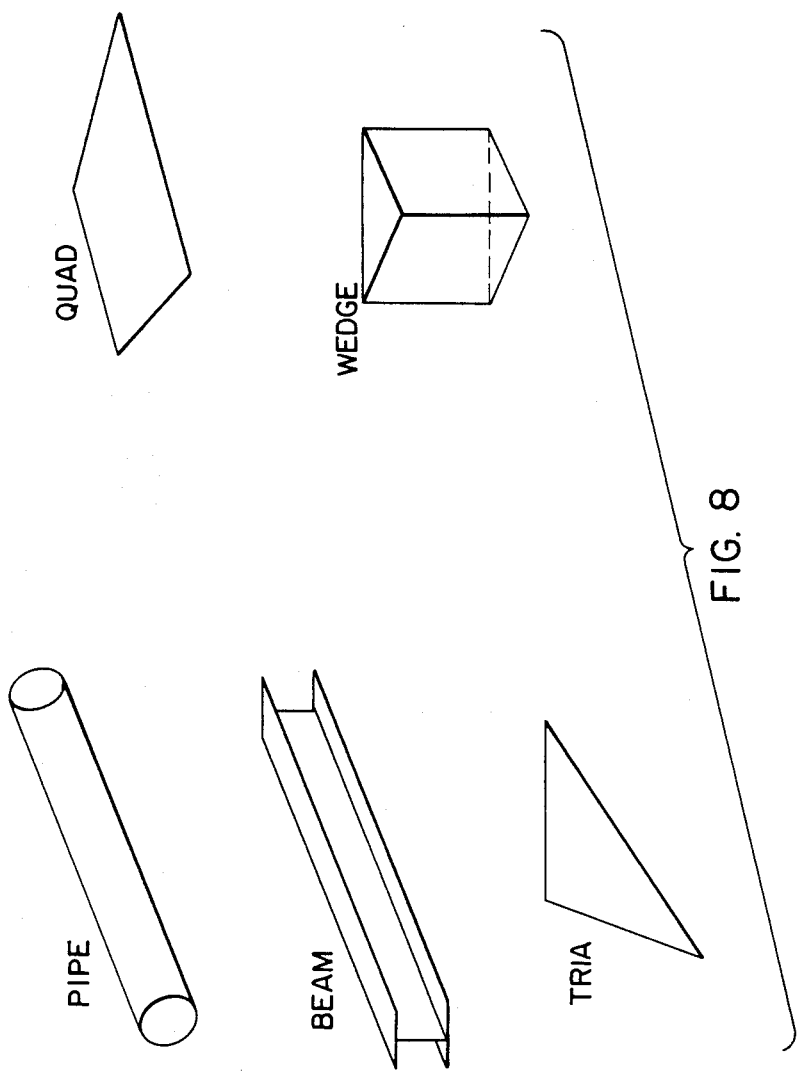
FIG. 8 depicts typical "finite element" types used in the database of the design system of the present invention.
Figure 9:
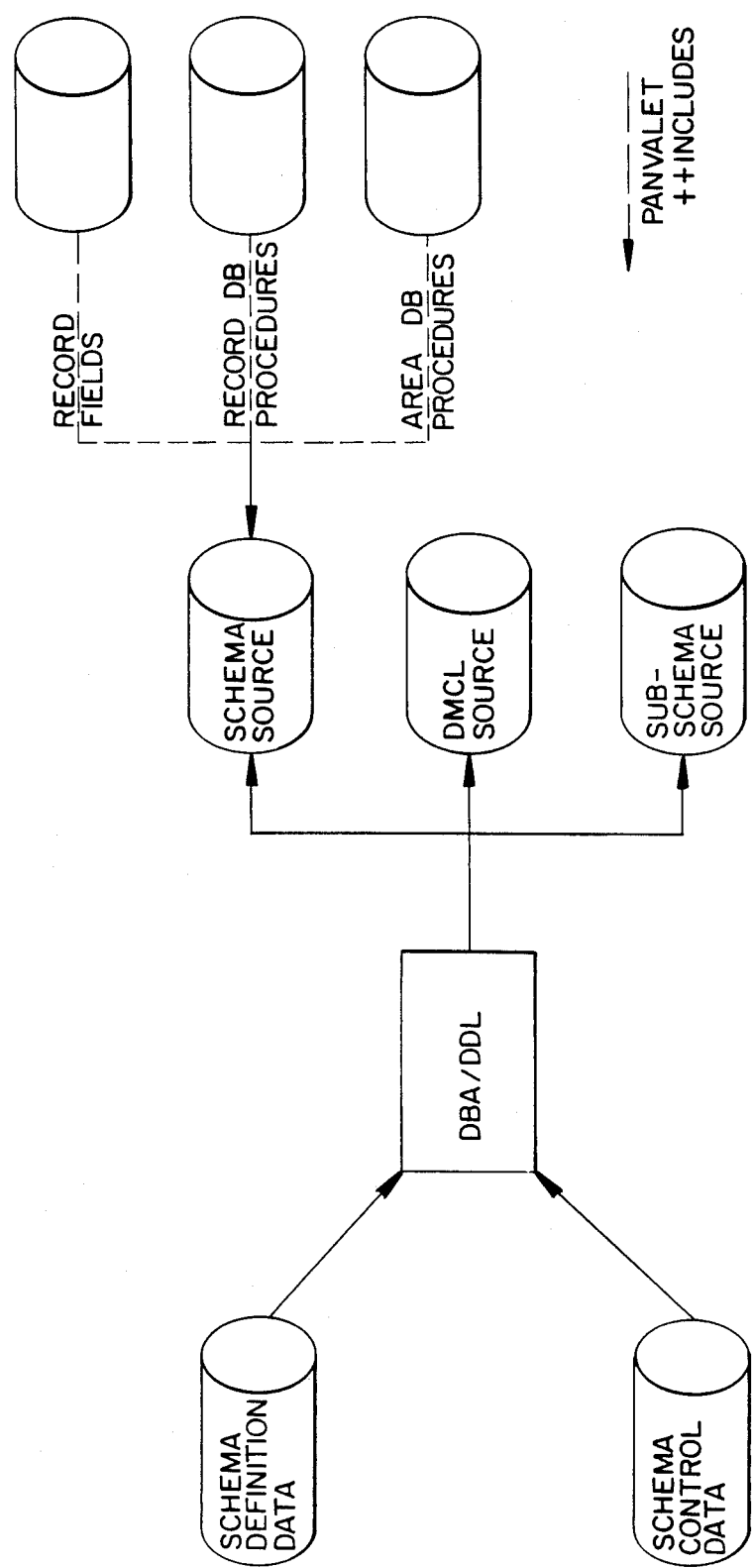
FIG. 9 depicts the program input and output files of the present design system.

A good illustrative example of this is that given in FIG. 4, which shows three m:n relationships, namely, those between Super Elements and Finite Elements, between Super Elements and Nodes, and between Finite Elements and Nodes. The LINK Record FE-NODE and the two Sets FE-NODES and NODES-FE represent the m:n relationship between FE and NODE, in which a single FE may have one or more NODEs and a single NODE may belong to more than one FE. Similarly, the m:n relationship between SE and FE is represented by the LINK Record SE-FE, and the two Sets SE-FES and FE-SE. Finally, the LINK Record SE-NODE represents the m:n relationship between SE and NODE. Also shown is the SE-LEVEL Record, which is just a special case of a LINK Record, required in this case to represent an m:n relationship between a Schema Record and itself (usually referred to as a Bill of Materials-type of relationship). In this instance, it is used to define multi-level (i.e. nested) Super Elements.

The first form of redundancy in this example is the storage of the value of the following primary keys within the LINK Records:

The SE-NODE LINK Record contains both se# and n#.

The SE-FE LINK Record contains fe#.

The FE-NODE LINK Record contains both fe# and n#.

The second form of redundancy results from the existence of the SE-FE and SE-NODE Records, although only one of them is really needed In this particular case, the need to get all Nodes in a Super Element, or all Finite Elements in a Super Element, is equally important to Application Programs and relevant queries. It is worth mentioning here that this form of redundancy could, if not properly controlled, lead to inconsistencies in the database. In the system database 18, the Application Program responsible for creating the two Sets of LINK Records treats the whole operation of creating a Super Element as one transaction, and is essentially a matter of either all or nothing. This means that if, and only if, all the LINK Records are successfully stored, does the appropriate Application Program issue an IDMS COMMIT, otherwise it nullifies the entire transaction by issuing an IDMS ROLLBACK.

ERASE Control

The system database 18 is so designed as to allow erasing whole groups of related data with minimal effort, by using the ERASE . . . ALL DML command and applying it to the Schema Record owning all the related data. For example:

The entire system database may be erased by deleting the one and only occurrence of the SDB Schema Record.

An entire Model may be erased by deleting the corresponding occurrence of the MODEL Record.

All offshore related data may be erased by deleting the OFFSHORE-CNTRL Record occurrence of a given Model.

All foundation data may be erased by deleting the SOIL-CNTRL Record occurrence of a given Model.

Furthermore, the structure of the system database 18 is such that under no condition would any Schema Record occurrences be left behind, after an application of an ERASE ALL or ERASE command, with no apparent access route to them. This has been achieved by careful database design and suitable Schema Set membership options Database Administration Aids At the very outset of the system database design stage, Schema, DMCL and Sub-schema modules were manually coded and Data Structure Diagrams were plotted by hand. Also, the recommended clock rule method, for keeping track of Set pointer positions needed in the Schema DDL source, was very cumbersome indeed. It thus became clear that the complexity of the system database 18, would have made it very difficult to continue it's development using the aforesaid methods. Consequently, several database administration tools were developed in order to automate the above onerous and tedious tasks. They include:

EBN: An Extended Bachman Notation.

DBA/DDL Program: A DDL generator for Schema, DMCL and Sub-schema source code.

DBA/DOC Program: A documentation generator for each Schema Record and Schema Set.

DBA/SPACE Program: A utility to calculate the physical disk space requirements.

DBA/PLOT Program: A plotting program for Data Structure Diagrams.

We now describe the above tools in more detail.

Extended Bachman Notation (EBN)

This is an extension of the well-known Bachman notation, in which a structured naming, identification and cross-referencing system has been devised in order to make the automation of various database administration functions possible.

DDL Generator (DBA/DDL Program)

This program is written PL/1, and is now one of the most useful software tools available to Database Administrators.

This program has two input files (FIG. 10):

1. Schema definition file: This is a simple fixed-format file in which all the Schema components are defined.

2. Run control file: This is a free-format file in which all the run-time parameters and options are defined.

The program produces three output files:

Schema DDL source code.

DMCL source code.

Sub-schema DDL source code.

The DDL source code generated by the program includes all Files, Area, Records and Sets contained in the Schema, as well as all possible options allowed by the DDL syntax. Although this, in general, results in the source code being much more than may be actually needed for a given design, it is a fairly simple task to use any online text editor to delete any unwanted code and/or options.

The DBA/DDL Program offers the following major features and/or benefits:

The Schema, DMCL and Sub-schema DDL source code is guaranteed to be syntactically correct.

Extensive validation checks are carried out by the program to ensure that the Schema DDL source code is error-free before it is passed to the IDMS Schema compiler, thus saving considerable processing time without cluttering the IDMS data dictionary with useless information.

The automatic calculation and tracking of Set pointer positions obviates the need to use the cumbersome clock rule method mentioned earlier. This also makes subsequent Schema design changes with which Sets are added, modified or deleted. A simple task, particularly at the early design stages.

Calls for the database Procedures, IDMSCOMP and IDMSDCOM, are automatically included in the Schema DDL source code for all Fixed Compressed (FC) and Variable Compressed (VC) Schema Records. For example, IDMSCOMP is invoked to compress a Schema Record occurrence before a STORE or MODIFY operation, whereas IDMSDCOM is called after a GET or OBTAIN operation to decompress a Record occurrence.

Absolute page numbers are automatically computed and generated based on relative Page numbers or Area sizes defined by the Database Administrator. This eliminates some tedious manual calculations and guarantees the correctness of the resulting values.

Alias Area names, based on a one-letter suffix defined by the Database Administrator, may be automatially generated, thus providing a simple, error-free procedure for creating multiple database environments, basd on some reference Schema. This particular feature is extremely useful for distinguishing between a production database and one or more test databases, all running under one IDMS DC/CV.

A minimum space option allows the Database Administrator to go through the motions of generating the entire DDL source code without having to worry about the exact Page numbers or Area sizes, which is extremely useful at the early stages of the Schema design. In this case, the program simply defaults all Area sizes to the minimum allowed, which for IDMS is two Pages.

The program uses a very convenient identification system based on 4-digit numbers, prefixed by a unique one-letter prefix to refer to Files (F), Areas (A), Records (R), Sets (S), and Members of Sets (M).

The program includes options for the generation of DDL source code statements required to define different synonyms, to be used for different DML languages such as COBOL, PL/1, FORTRAN, ASSEMBLER, as well as different headers for OLQ or CULPRIT. These may be later edited using any available online text editor.

Record and Set Documentation Generator (DBA/DOC Program)

Figure 10:
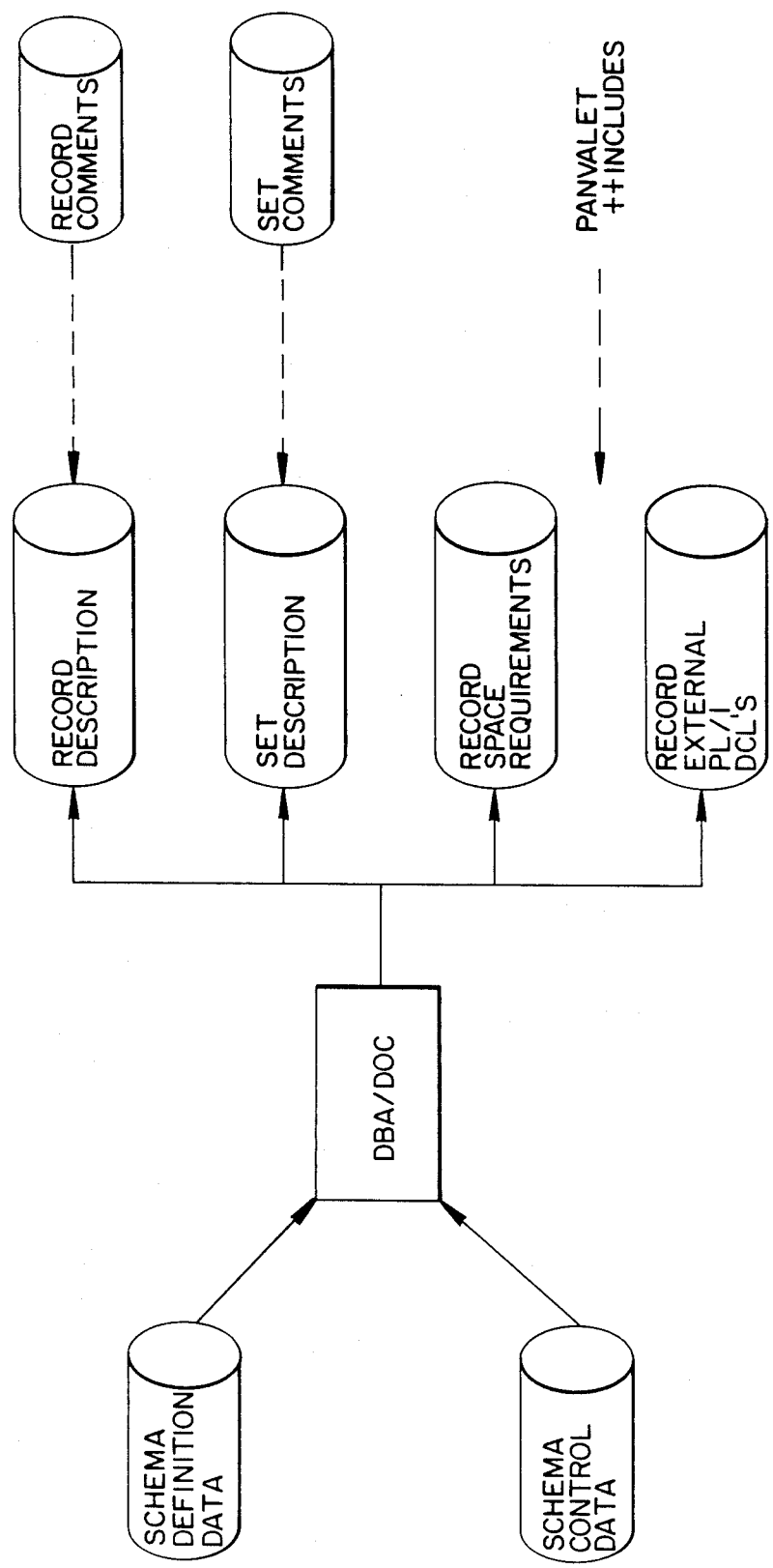
FIG. 10 depicts further the program input and output files of the present system.

This program, written in PL/1, is essentially part of the previous DBA/DDL Program, which may be invoked by an optional run-time parameter (FIG. 10). If selected, the program produces valuable, properly-formatted documentary material for use by the Database Administrator, or indeed, by anyone interested in the system database. This documentary material consists of two components:

1. Record documentation: This is one page per Schema Record, using Extended Bachman Notation.

2. Set documentation: This is one page per unique Schema Set, using Extended Bachman Notation; multi-member Sets would appear on multiple pages.

Both files contain necessary INCLUDE statements (or equivalent), in order to include any documentary text created by the Database Administrator, and stored externally in a source library, which may be created and maintained using any online text editor. Furthermore, the program has a SCRIPT option, which outputs the above two files in a form compatible with the IBM mainframe text processing system, SCRIPT/VS. This particular option makes it possible to automatically generate page numbers, as well as a useful index based on certain keywords.

Finally, the simple 4-digit identification system mentioned earlier is fully utilized here for producing the appropriate page headers and for the automatic generation of index keywords used in SCRIPT.

Disk Space Reporter (DBA/SPACE Program)

This utility program uses the CULPRIT report generator in order to assist the Database Administrator in calculating the exact number of Pages and Page sizes for each Schema Area.

Figure 11:
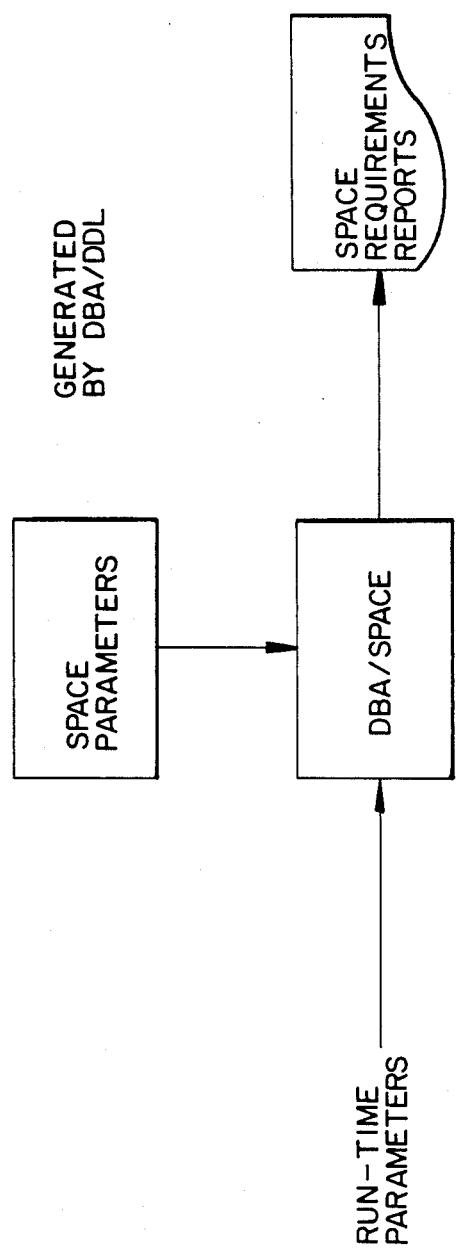
FIG. 11 depicts program space input and output files of the present design system.

The program has two input files (FIG. 11):

1. Record Definition File: This is a simple fixed-format file which contains one line per Schema Record, together with some identification data. Except for the first two fields in each line, the rest of the entries are automatically generated as a byproduct of the DBA/DDL Program. All the Database Administrator has to do is to edit the file online and insert the appropriate values in the two undefined fields, which are simply: the expected number of Record occurrences and the percentage probability of this number.

2. Run control file: This contains only a few optional parameters in order to control the run.

The program produces two output reports:

Space requirements for each Schema Record: this shows the actual Schema Record data length and the Record overhead (due to Set pointers).

Space requirements for each Schema Area: this shows the total number of Pages needed by each Area to accomodate the various Schema Records, together with the total space required by the database itself.

The DBA/SPACE Program offers the following major features and/or benefits:

The space taken by the Set pointers, depending on the pointer options chosen (i.e. NEXT, PRIOR, OWNER) is automatically included.

The space taken by the hidden CALC Set pointers, maintained internally by IDMS, is automatically accounted for The Space Management Information (SMI) Pages (87) which are reserved by IDMS at the beginning of each Area are included and properly identified.

The page overhead reserved by IDMS (e.g. Page header, footer and line index) is also accounted for.

Any Schema Area, which, because of the chosen Page size, cannot accommodate a minimum number of Schema Record occurrences, is flagged for the attention of the Database Administrator, thus highlighting a potential design inefficiency.

Similarly, any Area Page, which cannot be fully utilized, is flagged for the Database Administrator. This is usually the case when a large Page size is used to store very short Schema Record occurrences, since IDMS can only store a maximum of 225 lines (i.e. Schema Record occurrences) per Page, no matter how large the Page is.

Data Structure Diagram Plotter (DBA/PLOT Program)

This program, written in PL/1 and FORTRAN, is a great productivity software tool and is used to plot Data Structure Diagrams using the Extended Bachman Notation.

The input to the program consists of three files:

1. Schema definition file: This is the same file referred to earlier in the DBA/DDL Program.

2. Plot definition file: This is a fixed-format file defining the general layout of the Schema Records and sets to be plotted.

3. Run control file: This is a free-format file in which all the run-time parameters and options are defined, (e.g. overall scaling factor and color assignment).

The output from the program usually consists of a plot tape ready for plotting on any Calcomp-compatible multi-pen drum plotter. It is also possible to produce similar plots on a Tektronix graphics display unit by using the appropriate software interface.

The DBA/PLOT Program offers the following major features and/or benefits:

The program is driven by the same Schema definition file used by the DBA/DDL Program to generate the Schema, thus eliminating any possible inconsistencies between the Schema and the corresponding Data Structure Diagram.

The program includes options to plot the entire Data Structure Diagram or selectd portions or views of it (e.g. Sub-Schemas).

The physical size of the plot can be determined by the Database Administrator by choosing the appropriate scaling factors, or may be automatically generated by the program.

Records, Sets, titles, grid lines, etc. may be optionally plotted in any one of four different colors. For example, this facility may be used to distinguish LINK Records from others by plotting them in red, and everything else in black.

Although the IDMS/SPF facility (secondary indexing) is not used in the system database, the program automatically recognizes indexed sets, and it is thus able to plot the appropriate triangular symbols used to identify such Sets.

In addition to plotting the basic information of a Data Structure Diagram, the program also plots the 4-digit identifiers mentioned earlier for convenience and ease of cross-referencing with the Schema DDL source code or other documentation.

Optional summary plots may be produced on small size paper for quick reference. These are skeleton Bachman plots, on which only the Schema Record and Schema Set names are shown.

The program includes various run-time options for annotating the Data Structure diagram with titles, summary of abbreviations and border lines. Such annotation is fully controllable in terms of positioning orientation, size and color.

Samples of a full and summary Data Structure Diagram produced by the DBA/PLOT Program are given at the end of the report.

Choice of DBMS

The inventor after experimenting with two types of DBMSs: MRI/SYSTEM 2000 (Hierachic) and XEROX/EDMS (Network). It was concluded that the complex network data structures inherent in Finite Element Models would have been difficult, if not impossible, to model using a hierarchic DBMS. This can be easily visualized from the example given earlier in FIG. 4, showing the m:n relationships between Nodes and Finite Elements; between Super Elements and Finite Elements; and between Super Elements and Nodes. Although that example is only a small portion of the overall Data Structure Diagram, it is very typical of the complex network-type rlationships in the system.

Having eliminated hierarchical DBMSs for the system, it was also fairly simple to eliminate the possibility of using any relational DBMSs, mainly due to their inefficiency in handling extremely large databases such as the system.

The inventor conducted a survey of the available network-type DBMSs. This indicated that Cullinet's IDMS was the most suitable network-type DBMS for implementing the system database. Other factors in favor of IDMS were: it's data dictionary-driven concepts; it's apparent ease of installation; it's comprehensive range of complementary products; and it's good track history as indicated by it's consistent appearance in the Datapro Honor Roll. Furthermore, the fact that IDMS followed some industry standards (i.e. CODA-SYL), was considered to be important.

DBMS Components

Figure 12:
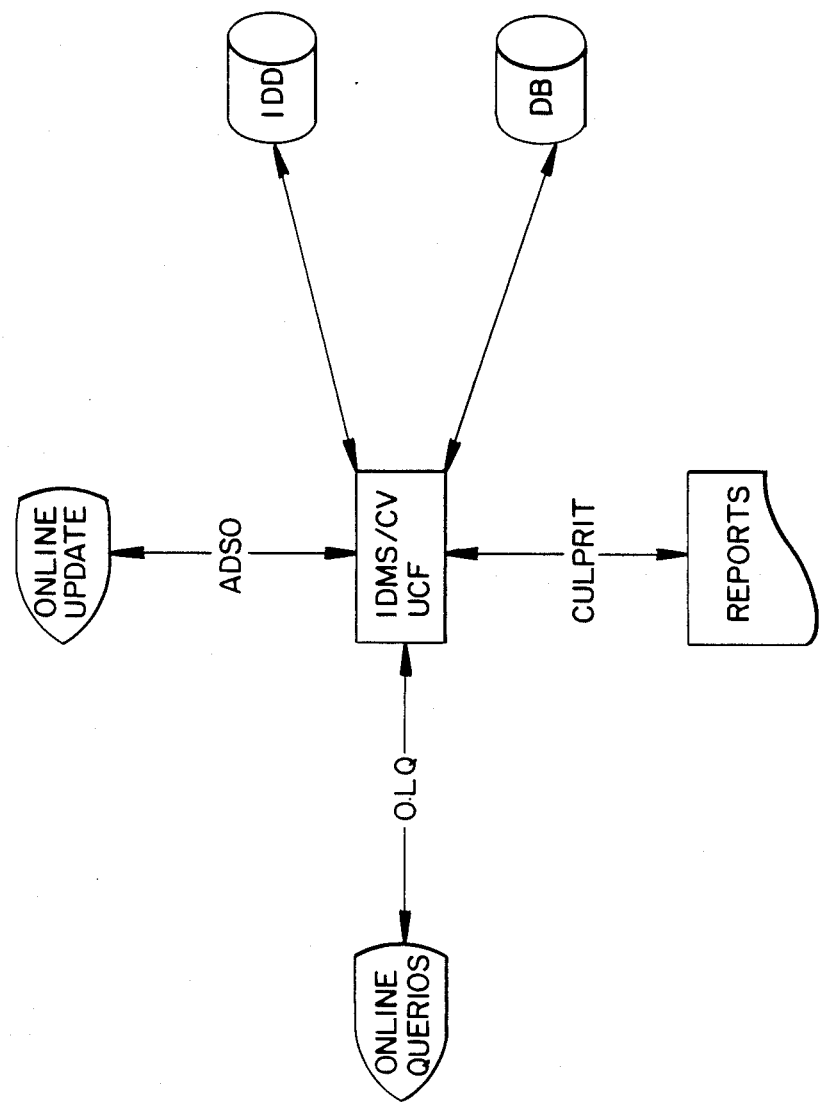
FIG. 12 depicts the components of the database management system of the present design system.

The following components of IDMS are needed for the implementation of the system (FIG. 12):

IDMS/CV: This is the Central Version of IDMS, which also includes the DMBS executive.

IDMS/IDD: This is the Integrated Data Dictionary, which drives the entire system.

IDMS/OLQ: This is the Online Query, which provides an English-like online query facility.

IDMS/CULPRIT: This is IDMS's own batch retrieval system for producing batch reports.

IDMS/ADSO: This is IDMS's Application Development System, which is used to develop online Application Programs.

IDMS/UCF: This is a Universal Communications Faclity, which allows ADSO applications to run under any teleprocessing monitor without alteration.

A CRITICAL ASSESSMENT OF THE SYSTEM

From the foregoing it will be seen that the benefits of the system to the various User groups and disciplines within an offshore engineering construction Organization have been clearly shown. Managing large-scale Finite Element Models of offshore structures is no longer a chore. The system now makes it possible to design safer structures at less cost and in shorter times.

The system database is schematically represented as a data structure diagram in FIGS. 13(a) and 13(b). Link Records are shown as dotted blocks in the FIG. 13.

This schema along with the following schema listing utilizing the schematic of FIG. 13 details the system sufficiently to enable one skilled in the art to construct the present system. Certain modifications and improvements have been deleted herein for the sake of conciseness and readability but are clearly intended to be within the scope of the following claims. As an example, although the database has been described with respect to offshore structure modelling and design, it could just as well be applied to other applications such as aerospace vehicle modelling and design, shipbuilding, etc.

I claim:

1. A method of designing an offshore structure according to code requirements using a finite element method of first modelling the structure with said modelling comprising the steps of:
   analyzing the structure to break it down in terms of known and developed finite elements and nodes connecting these finite elements, with the finite elements and nodes chosen from a library of such known finite elements and nodes;
   condensing the finite elements and nodes into a smaller number of super elements and super nodes by combining certain finite elements and nodes;
   determining equilibrium conditions of the super elements and super nodes at interface points of the offshore structure such as the water and mud lines to provide boundary conditions;
   analyzing the condensed structure using the boundary conditions to provide displacements and forces and stresses on the structure; and
   checking the displacements and forces and stresses on the elements against industry code standards to determine if they conform with such standards.

2. A method as set forth in claim 1 further including the steps of:
   changing the design of the structure in areas where there is a lack of conformity with the standards; and
   repeating the finite analysis steps for the changed design.

3. A method as set forth in claim 2 further including the steps of:
   applying environmental loads to the elements produced by estimated loads due to waves and winds to determine the maximum shear forces and bending moments on the structure at points of discontinuity of the structure to produce an environmentally loaded model.

4. A method as set forth in claim 3 including the further step of:

reducing the environmentally loaded model into a reduced stiffness matrix and a reduced force matrix to allow condensation of the model.

5. In a design system controlling the input and output of modelling data to and from a finite element model database by a database management system having:

a source of modelling design data;

a database having a finite element structural model formed therein based on the modelling data provided from the source with the improvement comprising;

a network type database management system for communicating the modelling design data between said database and said source of data; and said database being an engineering database compatible with said network type database management system.

6. A system as set forth in claim 5 wherein said database is an engineering database having floating point numbers.

7. A system as set forth in claim 5 wherein said database has a finite element model of an offshore structure.

8. A system as set forth in claim 7 wherein said finite element model is structured by said database management system to include super elements and nodes.

9. A system as set forth in claim 8 wherein said database includes relational links between super elements and nodes.

10. A system as set forth in claim 9 wherein said database includes relational links between super elements and finite elements.

11. A system as set forth in claim 10 wherein said database utilizes an Extended Bachman Notation.

12. A system as set forth in claim 5 wherein said source of modeling design data includes a design engineering data source linked to said database for inputting a finite element model into said database and a plurality of non-design engineering data sources connected to said database for obtaining model data from said database without being able to input any data into said database.

13. A system as set forth in claim 12 wherein said plurality of non-design engineering data sources are concurrently connected to said database with said design engineering data source.

14. A system as set forth in claim 13 wherein said database includes environmental data associated with said model.

15. A system as set forth in claim 14 wherein said model is an offshore oil platform and said environmental data includes soil condition curves for the soil in which said oil platform is located.

16. A system as set forth in claim 7 wherein said database includes instances of all finite elements comprising data items into a record by virtue of some data items sharing a geometrical design requirement.

17. A system as set forth in claim 16 wherein said database includes a listing of all finite element data items into a record by virtue of some data items having a common fabrication requirement.

18. A system as set forth in claim 17 wherein said database management system includes a security code preventing unauthorized access of said database.

19. A system as set forth in claim 18 wherein said security code includes a single MASTER User allowing unrestricted access to one model in said database.

20. A system as set forth in claim 19 wherein said security code includes limited access to data in said database with no ability to input data into said database.

21. A system as set forth in claim 5 wherein said database management system is a network type database management system.

22. A system as set forth in claim 5, wherein the network type database management system is a collinet IDMS database management system.

23. An automated design system for designing an engineering database model and being controlled by a database management system comprising:

a database containing in excess of 200,000 Finite Elements data records for designing the engineering model therein; and a network type database management system connected to said database for changing the records of said database with a single transactional entry into said database.

24. An automated design system as set forth in claim 23 wherein said database management system is a network type database management system.

25. A system as set forth in claim 24 wherein the database is universally accessible only when the modelled structure meets the code requirements.

26. A system as set forth in claim 23, wherein the network type database management system is a cullinet IDMS database management system.

27. A method of modelling a code compatible offshore structure anchored in the bottom of the water and having a portion above the water in a database using finite element analysis techniques comprising the steps of:

choosing various dimensions for the offshore structure;

converting the dimensioned offshore structure into a series of known finite elements and nodes connecting same and inputting the data into the database;

reducing the converted structure within the database into a smaller series of super elements and super nodes connecting same;

performing a non-linear, interaction analysis in the database to determine equilibrium conditions at the bottom of the water;

performing a static analysis on the reduced structure in the database using the equilibrium conditions from the non-linear interaction analysis to show the node displacements and stresses on the elements; and comparing the node displacements and element stresses to allowable offshore structure code requirements to determine if they are compatible with the code requirements.

28. A method as set forth in claim 27 wherein a new series of dimensions are chosen for the offshore structure when the code requirements are not met and the structure is again subjected to the finite element analysis.

* * * * *

UNITED STATES PATENT AND TRADEMARK OFFICE
CERTIFICATE OF CORRECTION

PATENT NO. : 4,858,146
DATED : Aug. 15, 1989
INVENTOR(S) : Nader O. Shebini

It is certified that error appears in the above-identified patent and that said Letters Patent is hereby corrected as shown below:

On the first page of the patent, immediately following "Assignee", kindly delete "The Babcock & Wilcox Company" and insert therefor --McDermott Incorporated--.

Signed and Sealed this

First Day of January, 1991

Attest:

HARRY F. MANBECK, JR.

*Attesting Officer*   *Commissioner of Patents and Trademarks*